(12) United States Patent
Kim et al.

(10) Patent No.: US 11,348,625 B2
(45) Date of Patent: *May 31, 2022

(54) ENABLE SIGNAL GENERATION CIRCUIT AND SEMICONDUCTOR APPARATUS USING THE SAME

(71) Applicant: SK hynix Inc., Icheon-si (KR)

(72) Inventors: Mino Kim, Icheon-si (KR); Hyeong Soo Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/187,260

(22) Filed: Feb. 26, 2021

(65) Prior Publication Data

US 2021/0183424 A1 Jun. 17, 2021

Related U.S. Application Data

(63) Continuation-in-part of application No. 16/730,206, filed on Dec. 30, 2019, now Pat. No. 10,943,629.

(30) Foreign Application Priority Data

Jun. 4, 2019 (KR) ........................ 10-2019-0065721

(51) Int. Cl.
| | |
|---|---|
| *G11C 7/00* | (2006.01) |
| *G11C 8/18* | (2006.01) |
| *G11C 8/10* | (2006.01) |
| *G11C 7/10* | (2006.01) |
| *G11C 8/04* | (2006.01) |

(52) U.S. Cl.
CPC ............... *G11C 8/18* (2013.01); *G11C 7/106* (2013.01); *G11C 7/1063* (2013.01); *G11C 7/1087* (2013.01); *G11C 8/04* (2013.01); *G11C 8/10* (2013.01)

(58) Field of Classification Search
CPC ......... G11C 8/18; G11C 7/106; G11C 7/1063; G11C 7/1087; G11C 8/04; G11C 8/10
USPC ........................................................ 365/193
See application file for complete search history.

(56) References Cited

U.S. PATENT DOCUMENTS

| | | | |
|---|---|---|---|
| 10,943,629 B2* | 3/2021 | Lee | ..................... G11C 29/787 |
| 2011/0317497 A1 | 12/2011 | Yoon et al. | |
| 2012/0144277 A1 | 6/2012 | Lee et al. | |

FOREIGN PATENT DOCUMENTS

KR 1020150136675 A 12/2015

\* cited by examiner

*Primary Examiner* — Huan Hoang
(74) *Attorney, Agent, or Firm* — William Park & Associates Ltd.

(57) ABSTRACT

A semiconductor apparatus includes a command decoding circuit and an enable signal generation circuit. The command decoding circuit generates an operation code and a strobe pulse based on a command signal and a clock signal. The enable signal generation circuit generates a seed signal based on the operation code and the strobe pulse and generates an enable signal by shifting the seed signal. The enable signal generation circuit generates a plurality of guard keys based on a plurality of operation codes and the strobe pulse and prevents the generation of the enable signal for a predetermined time when the plurality of guard keys are not sequentially enabled.

21 Claims, 11 Drawing Sheets

221

ENABLE SIGNAL GENERATION CIRCUIT AND SEMICONDUCTOR APPARATUS USING THE SAME

CROSS-REFERENCES TO RELATED APPLICATION

This application is a continuation-in-part of U.S. patent application Ser. No. 16/730,206, filed on Dec. 30, 2019, which claims priority under 35 U.S.C. 119(a) to Korean Application No. 10-2019-0065721, filed on Jun. 4, 2019, in the Korean Intellectual Property Office, which are incorporated herein by references in their entirety.

BACKGROUND

1. Technical Field

Various embodiments generally relate to an integrated circuit technology, and more particularly, to an enable signal generation circuit to generate an enable signal and a semiconductor apparatus using the same.

2. Related Art

An electronic device may include many electronic components. Among the electronic components, a computer system may include a large number of semiconductor apparatuses, composed of semiconductors. The semiconductor apparatuses, constituting the computer system, may communicate with one another while transferring and receiving clock signals and data. The semiconductor apparatuses may perform data communication in synchronization with a clock signal.

The semiconductor apparatuses may be divided into a host apparatus and a slave apparatus. The host apparatus may provide a control signal to the slave apparatus, such that the slave apparatus can perform various operations. For example, the host apparatus may provide the slave apparatus with a control signal, such as a command signal, an address signal or a request.

The slave apparatus may internally generate various signals, based on the control signal, transferred from the host apparatus. Some of the internal signals, generated by the semiconductor apparatus, may function as an enable signal, and be used to enable or disable internal circuits, such that the semiconductor apparatus can perform a specific operation.

SUMMARY

In an embodiment, a semiconductor apparatus may include a command decoding circuit and an enable signal generation circuit. The command decoding circuit may be configured to generate an operation code and a strobe pulse based on a command signal and a clock signal. The enable signal generation circuit may be configured to generate a seed signal based on at least a part of the operation code and the strobe pulse, configured to generate a plurality of guard keys based on the plurality of operation codes and the strobe pulse after the seed signal is generated, configured to generate an enable signal by shifting the seed signal, and configured to prevent the generation of the enable signal for a predetermined time when one or more of the plurality of guard keys are not sequentially enabled. [Summary, Based on our amendments made to the independent claims we amended this section for broadening purposes to encompass what is now claimed.]

In an embodiment, a semiconductor apparatus may include a command decoding circuit, a seed signal generation circuit, a guard key generation circuit, a guard key reset circuit, a guard key access control circuit, and an enable signal output circuit. The command decoding circuit may be configured to generate an operation code and a strobe pulse based on a command signal and a clock signal. The seed signal generation circuit may be configured to generate a seed signal based on at least a part of the operation code and the strobe pulse. The guard key generation circuit may be configured to generate a plurality of decoding signals by decoding the plurality of operation codes and configured to generate a plurality of guard keys from the plurality of decoding signals based on the strobe pulse. The guard key reset circuit may be configured to generate a plurality of enable reset signals based on the plurality of guard keys and a guard key enable signal. The guard key access control circuit may be configured to generate the guard key enable signal based on the plurality of guard keys. The enable signal output circuit may be configured to generate an enable signal by shifting the seed signal in synchronization with a shifting clock signal and configured to prevent the generation of the enable signal based on the plurality of enable reset signals.

In an embodiment, an enable signal generation circuit may include a guard key generation circuit, a guard key reset circuit, a guard key access control circuit, and an enable signal output circuit. The guard key generation circuit may be configured to generate n decoding signals by decoding n operation codes that are sequentially inputted and configured to generate the n decoding signals as first to $n^{th}$ guard keys based on a strobe pulse, wherein n is an integer equal to or greater than 2. The guard key reset circuit may be configured to generate first to $n^{th}$ enable reset signals based on the first to $n^{th}$ guard keys and a guard key enable signal. The guard key access control circuit may be configured to generate the guard key enable signal based on the first to $n^{th}$ guard keys. The enable signal output circuit may be configured to generate first to $n^{th}$ shifting signals by shifting a seed signal based on a shifting clock signal, configured to generate an enable signal based on the $n^{th}$ shifting signal, and configured to reset the first to $n^{th}$ shifting signals based on the first to $n^{th}$ enable reset signals.

DETAILED DESCRIPTION

Figure 1:
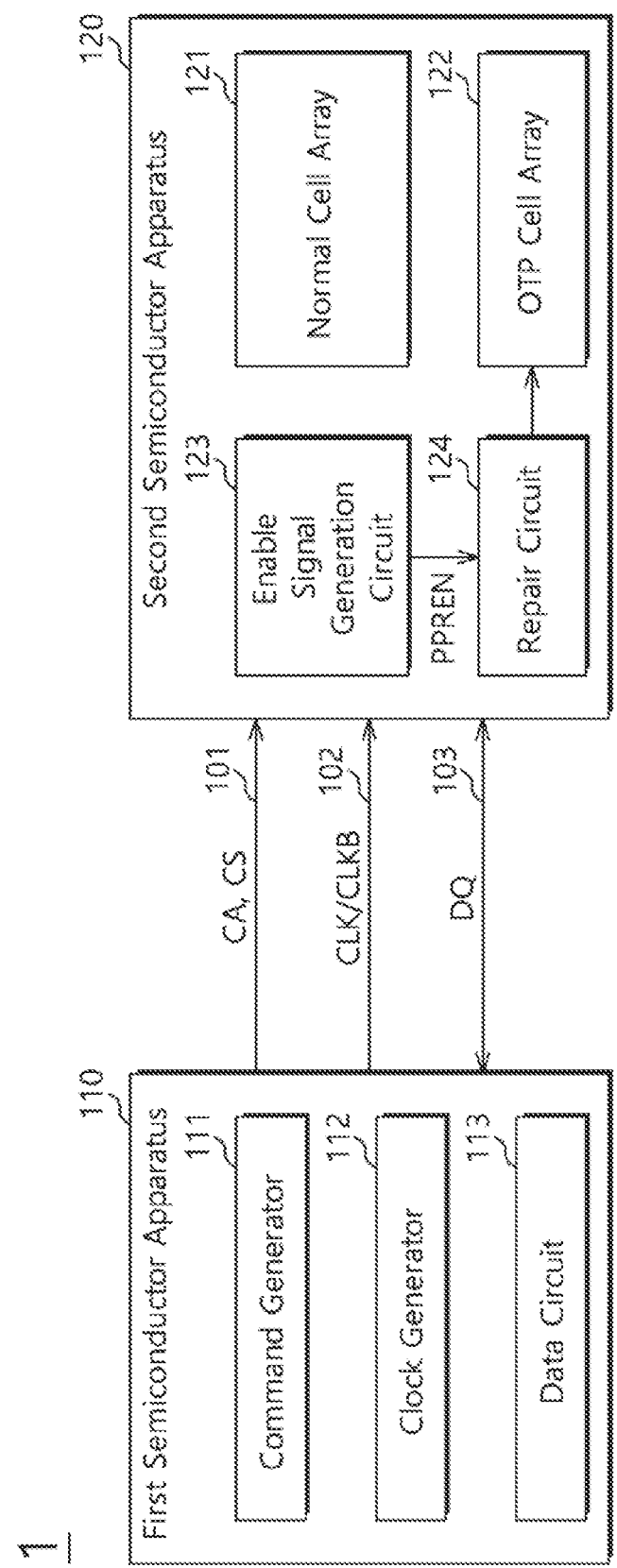
FIG. 1 is a diagram, illustrating a configuration of a system, in accordance with an embodiment.

Specific structural or functional descriptions of embodiments based on the concept which are disclosed in the present specification or application are illustrated only to describe the embodiments based on the concept of the present disclosure. The embodiments based on the concept of the present disclosure may be carried out in various forms and the descriptions are not limited to the embodiments described in the present specification or application.

Since various modifications and changes may be applied to the embodiment based on the concept of the present disclosure and the embodiment based on the concept of the present disclosure may have various forms, the specific embodiments will be illustrated in the drawings and described in the present specification or application. However, it should be understood that the embodiment based on the concept of the present disclosure is not construed as limited to a specific disclosure form and includes all changes, equivalents, or substitutes that do not depart from the spirit and technical scope of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope based on the concept of the present disclosure.

It should be understood that when a component is referred to as being "connected" or "coupled" to another component, the component may be directly connected or coupled to the other element or an intervening component may also be present. In contrast, it should be understood that when a component is referred to as being "directly connected" or "directly coupled" to another component, no intervening component is present. Other expressions describing relationships between components such as "between," "immediately between" or "adjacent to", "directly adjacent to", and the like should be construed similarly.

The terms used in the present specification are merely used to describe a specific embodiment, and are not intended to limit the present disclosure. Singular expression includes a plural expression, unless the context clearly indicates otherwise. In the present specification, it should be understood that a term "include", "have", or the like indicates that a feature, a number, a step, an operation, a component, a part, or a combination thereof described in the present specification is present, but do not exclude a possibility of presence or addition of one or more other features, numbers, steps, operations, components, parts, or combinations thereof.

So far as not being differently defined, all terms used herein including technical or scientific terminologies have meanings that they are commonly understood by those skilled in the art to which the present disclosure pertains. The terms defined in generally used dictionaries should be construed as with the same meanings as would be construed in the context of the related art, and unless clearly defined otherwise in the present specification, should not be construed as with idealistic or excessively formal meanings.

FIG. 1 illustrates a configuration of a semiconductor system 1, in accordance with an embodiment. In FIG. 1, the semiconductor system 1 may include a first semiconductor apparatus 110 and a second semiconductor apparatus 120. The first semiconductor apparatus 110 may serve as a master apparatus, which controls the second semiconductor apparatus 120 to perform various operations. The first semiconductor apparatus 110 may provide various control signals used for operations of the second semiconductor apparatus 120. The first semiconductor apparatus 110 may include various types of host apparatuses. For example, the first semiconductor apparatus 110 may include a CPU (Central Processing Unit), a GPU (Graphic Processing Unit), an MMP (Multi-Media Processor), a digital signal processor, an AP (Application Processor), or a memory controller. The second semiconductor apparatus 120 may serve as a slave apparatus, which is controlled by the first semiconductor apparatus 110, to perform various operations. The second semiconductor apparatus 120 may be a memory apparatus, for example, and the memory apparatus may include a volatile memory and a nonvolatile memory. The volatile memory may include an SRAM (Static RAM), DRAM (Dynamic RAM) and SDRAM (Synchronous DRAM), and the nonvolatile memory may include a ROM (Read Only Memory), PROM (Programmable ROM), EEPROM (Electrically Erasable and Programmable ROM), EPROM (Electrically Programmable ROM), flash memory, PRAM (Phase change RAM), MRAM (Magnetic RAM), RRAM (Resistive RAM), FRAM (Ferroelectric RAM) and the like.

The second semiconductor apparatus 120 may be coupled to the first semiconductor apparatus 110, through a plurality of buses. The plurality of buses may be signal transfer paths, links, or channels to transfer signals. The plurality of buses may include a command bus 101, a clock bus 102, and a data bus 103. The command bus 101 and the clock bus 102 may be one-way buses, and the data bus 103 may be a two-way bus. The second semiconductor apparatus 120 may be coupled to the first semiconductor apparatus 110, through the command bus 101, and receive a command signal CA/CS through the command bus 101. The command signal may include various control signals, such as a command address signal CA and a chip select signal CS. The second semiconductor apparatus 120 may be coupled to the first semiconductor apparatus 110, through the clock bus 102, and receive a clock signal CLK through the clock bus 102. The clock signal CLK may be transferred as one of the differential signals, with a complementary signal CLKB, or transferred as a single ended signal. The second semiconductor apparatus 120 may be coupled to the first semiconductor apparatus 110, through the data bus 103, and receive data DQ from the first semiconductor apparatus 110 or transfer data DQ to the first semiconductor apparatus 110 through the data bus 103.

The first semiconductor apparatus 110 may include a command generator 111, a clock generator 112, and a data circuit 113. The command generator 111 may generate the command signal CA/CS, which is to be transferred through the command bus 101. The clock generator 112 may include a clock generation circuit, such as a phase locked loop circuit. The clock generator 112 may generate the clock signal CLK, transferred through the clock bus 102. The data circuit 113 may generate data DQ and transfer the data DQ to the second semiconductor apparatus 120, through the data bus 103, and receive data DQ, transferred from the second semiconductor apparatus 120, through the data bus 103.

The semiconductor apparatus 120 may include a normal cell array 121, an OTP (One Time Programmable) cell array 122, an enable signal generation circuit 123 and a repair circuit 124. The normal cell array 121 may include a plurality of memory cells. The normal cell array 121 may include a plurality of word lines and a plurality of bit lines, and the plurality of memory cells may be coupled to the respective intersections between the plurality of word lines and the plurality of bit lines. The normal cell array 121 may store the data DQ, transferred from the first semiconductor apparatus 110. The second semiconductor apparatus 120 may output the data, stored in the normal cell array 121, as the data DQ to the first semiconductor apparatus 110. The OTP cell array 122 may include a plurality of OTP memory cells. The OPT memory cell may be a fuse. The fuse may be an electrical fuse or anti-fuse. The OTP cell array 122 may store defect information of the normal cell array 121 or operation information related to an operation of the second semiconductor apparatus 120.

The enable signal generation circuit 123 may be coupled to the command bus 101 and the clock bus 102, and receive the command signal CA/CS and the clock signal CLK. The enable signal generation circuit 123 may generate an enable signal PPREN based on the command signal CA/CS and the clock signal CLK. The enable signal PPREN may be used to enable the repair circuit 124. The enable signal PPREN may enable the repair circuit 124 so that the second semiconductor apparatus 120 can perform a post package repair operation. The post package repair operation may indicate an operation, which is performed to repair a defect of the normal cell array 121 of the second semiconductor apparatus 120, or to set operation information of the second semiconductor apparatus 120, after the second semiconductor apparatus 120 is packaged. The post package repair operation may be performed by programming the defect information of the normal cell array 121 or the operation information of the second semiconductor apparatus 120 to the OTP cell array 122.

The repair circuit 124 may receive the enable signal PPREN and may be enabled based on the enable signal PPREN. The repair circuit 124 may receive the command signal CA/CS and the data DQ from the first semiconductor apparatus 110, and perform a programming operation on the OTP cell array 122 based on the command signal CA/CS and the data DQ. When the OTP memory cell is configured as an electrical fuse, the repair circuit 124 may include a rupture circuit to rupture the electrical fuse.

Figure 2:
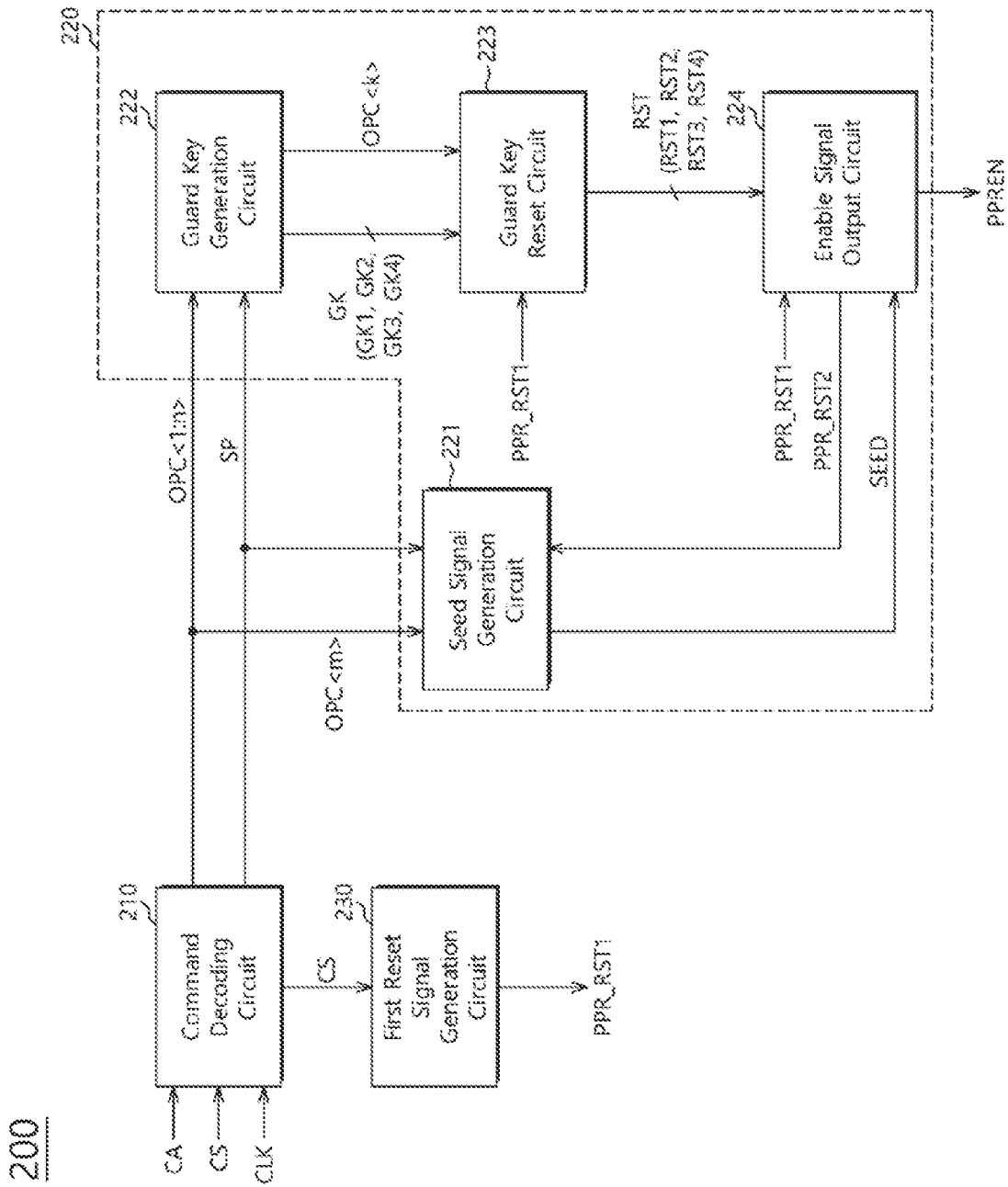
FIG. 2 is a diagram, illustrating a configuration of an enable signal generation circuit and a semiconductor apparatus, including the same in accordance with an embodiment.

FIG. 2 illustrates the configuration of an enable signal generation circuit 220 and a semiconductor apparatus 200, including the enable signal generation circuit 220, in accordance with an embodiment. In FIG. 2, the semiconductor apparatus 200 may include a command decoding circuit 210 and an enable signal generation circuit 220. The enable signal generation circuit 220 may be applied as the enable signal generation circuit 123 as illustrated in FIG. 1. The command decoding circuit 210 may be coupled to the command bus 101 and the clock bus 102, as illustrated in FIG. 1, may receive the command signal CA/CS through the command bus 101, and may receive the clock signal CLK through the clock bus 102. The command signal may include at least the command address signal CA and the chip select signal CS. The command decoding circuit 210 may generate an operation code OPC<1:n> by decoding the command address signal CA. The command decoding circuit 210 may generate a strobe pulse SP based on the clock signal CLK.

The command signal CA/CS may be inputted to the semiconductor apparatus 200 in synchronization with the clock signal CLK. The command decoding circuit 210 may generate the operation code OPC<1:n> whenever the command signal CA/CS is received in synchronization with the clock signal CLK. That is, the command decoding circuit 210 may sequentially generate the plurality of operation codes OPC<1:n> based on the command signals CA/CS, which are sequentially inputted. The strobe pulse SP may include a plurality of pulses, which are generated in synchronization with the clock signal CLK. The plurality of pulses of the strobe pulse SP may be outputted in synchronization with the operation code OPC<1:n>, whenever the operation code OPC<1:n> is outputted.

The operation code OPC<1:n> may include a plurality of bits. For example, the operation code may include n bits. Here, n may be an integer equal to or greater than 3. The command decoding circuit 210 may use the $m^{th}$ bit OPC<m> of the operation code OPC<1:n> to generate a seed signal SEED. Here, m may be an integer based on the following equation, $1 \leq m \leq n$. The operation code OPC<1:n> may be used to generate a guard key.

The enable signal generation circuit 220 may receive the plurality of operation codes OPC<1:n> and the strobe pulse SP. The enable signal generation circuit 220 may generate the seed signal SEED based on at least a part of the operation code OPC<1:n> and the strobe pulse SP. The enable signal generation circuit 220 may generate the seed signal SEED based on the $m^{th}$ bit OPC<m> of the operation code OPC<1:n> and the strobe pulse SP. For example, when the $m^{th}$ bit OPC<m> of the operation code OPC<1:n> is at a logic high level, the enable signal generation circuit 220 may enable the seed signal SEED in synchronization with the strobe pulse SP. The enable signal generation circuit 220 may generate the enable signal PPREN based on the operation code OPC<1:n>, the strobe pulse SP, and the seed signal SEED. The enable signal generation circuit 220 may generate a plurality of guard keys GK, from the plurality of operation codes OPC<1:n>, after the seed signal SEED is enabled. When the plurality of operation codes OPC<1:n> correspond to their expected values, the enable signal generation circuit 220 may enable the plurality of guard keys GK, respectively. When the plurality of operation codes OPC<1:n> differ from their expected values, the enable signal generation circuit 220 may disable the plurality of guard keys GK, respectively. When the plurality of guard keys GK are enabled, the enable signal generation circuit 220 may shift the seed signal SEED to enable the enable signal PPREN. When any one of the plurality of operation codes OPC<1:n> is different from the corresponding expected value, the enable signal generation circuit 220 may maintain the corresponding guard key GK in a disabled state, and enable an enable reset signal RST to prevent the generation of the enable signal PPREN. In an embodiment, the enable signal generation circuit 220 may further receive a first reset signal PPR_RST1. The enable signal generation circuit 220 may generate the enable reset signal RST based on the first reset signal PPR_RST1. When the first reset signal PPR_RST1 is enabled, the enable signal generation circuit 220 may enable the enable reset signal RST regardless of the guard key GK. In an embodiment, the enable signal generation circuit 220 may generate a second reset signal PPR_RST2 based on the guard key GK and the enable reset signal RST. The enable signal generation circuit 220 may reset the seed signal SEED based on the second reset signal PPR_RST2.

In FIG. 2, the enable signal generation circuit 220 may include a seed signal generation circuit 221, a guard key generation circuit 222, a guard key reset circuit 223, and an enable signal output circuit 224. The seed signal generation circuit 221 may receive at least a part of the operation code OPC<1:n> and the strobe pulse SP. The seed signal generation circuit 221 may generate the seed signal SEED based on the $m^{th}$ bit OPC<m> of the operation code OPC<1:n> and the strobe pulse SP. For example, when the $m^{th}$ bit OPC<m> of the operation code OPC<1:n> is at a logic high level, in a case where the strobe pulse SP is enabled, the seed signal generation circuit 221 may enable the seed signal SEED.

The guard key generation circuit 222 may receive the operation code OPC<1:n> and the strobe pulse SP. The guard key generation circuit 222 may sequentially receive the plurality of operation codes OPC<1:n> and generate the plurality of guard keys GK. For example, whenever the operation codes OPC<1:n> are inputted, the guard key generation circuit 222 may decode the operation codes OPC<1:n> to generate the plurality of guard keys GK. The following descriptions will be based on an embodiment with four guard keys GK. However, the present embodiment is not limited thereto. In other words, the number of the guard keys GK may be smaller or larger than four. The guard key generation circuit 222 may receive four operation codes OPC<1:n> and generate four guard keys GK. The guard key generation circuit 222 may generate four decoded signals, each with one bit, by decoding the four operation codes OPC<1:n>. The guard key generation circuit 222 may latch the decoded signal, whenever the strobe pulse SP is enabled, and generate the guard key GK based on the latched signal. In the present embodiment, it is exemplified that each of the decoded signals and the guard key GK have one bit. However, the guard key generation circuit 222 may be modified to generate the guard key GK, with two or more bits. When the operation code OPC<1:n> has a code value corresponding to the expected value, the guard key generation circuit 222 may enable the guard key GK to a logic high level. When the operation code OPC<1:n> has a code value different from the expected value, the guard key generation circuit 222 may disable the guard key GK to a logic low level.

The guard key reset circuit 223 may receive the plurality of guard keys GK from the guard key generation circuit 222. The guard key reset circuit 223 may generate a plurality of enable reset signals RST based on the plurality of guard keys GK. The guard key reset circuit 223 may generate four enable reset signals RST based on the four guard keys GK. When the guard key GK is enabled to a logic high level, the guard key reset circuit 223 may retain the enable reset signal RST in a disabled state. When the guard key GK is disabled to a logic low level, the guard key reset circuit 223 may enable the enable reset signal RST. The guard key reset circuit 223 may generate a first enable reset signal RST1 based on a first guard key GK1, and generate a second enable reset signal RST2 based on a second guard key GK2. The guard key reset circuit 223 may generate a third enable reset signal RST3 based on a third guard key GK3, and generate a fourth enable reset signal RST4 based on a fourth guard key GK4.

In an embodiment, the guard key reset circuit 223 may generate one enable reset signal RST based on at least a part of the operation code OPC<1:n> and the guard key GK. For example, the guard key reset circuit 223 may generate the enable reset signal RST based on the $k^{th}$ bit OPC<k> of the operation code OPC<1:n> and the guard key GK. Here, k may be an integer which ranges from 1 to n, but is not m. The guard key reset circuit 223 may generate the first enable reset signal RST1, based on the $k^{th}$ bit OPC<k> of the first operation code OPC<1:n> and the first guard key GK1, generated from the first operation code OPC<1:n>. The guard key reset circuit 223 may generate the second enable reset signal RST2, based on the $k^{th}$ bit OPC<k> of the second operation code OPC<1:n> and the second guard key GK2, generated from the second operation code OPC<1:n>. The guard key reset circuit 223 may generate the third enable reset signal RST3, based on the $k^{th}$ bit OPC<k> of the third operation code OPC<1:n> and the third guard key GK3, generated from the third operation code OPC<1:n>. The guard key reset circuit 223 may generate the fourth enable reset signal RST4, based on the $k^{th}$ bit OPC<k> of the fourth operation code OPC<1:n> and the fourth guard key GK4, generated from the fourth operation code OPC<1:n>. When the guard key reset circuit 223 generates the enable reset signal RST, based on at least a part of the operation code OPC<1:n> and the guard key GK, at least the part of the operation code OPC<1:n> can be used like a pre-decoding signal, which minimizes the number of logic gates in the guard key generation circuit 222 that decodes the operation code OPC<1:n>.

The guard key reset circuit 223 may further receive the first reset signal PPR_RST1. The guard key reset circuit 223 may enable the enable reset signal RST based on the first reset signal PPR_RST1. When the first reset signal PPR_RST1 is enabled, the guard key reset circuit 223 may enable all of the first to fourth enable reset signals RST1 to RST4, regardless of the first to fourth guard keys GK1 to GK4.

The enable signal output circuit 224 may receive the seed signal SEED and the enable reset signal RST. The enable signal output circuit 224 may generate the enable signal PPREN by shifting the seed signal SEED. The enable signal output circuit 224 may further receive a shifting clock signal SCLK and may shift the seed signal SEED in synchronization with the shifting clock signal SCLK. The shifting clock signal SCLK may be generated based on the clock signal CLK and/or the strobe pulse SP. The enable signal output circuit 224 may generate a plurality of shifted signals by sequentially shifting the seed signal SEED a plurality of times. The enable signal output circuit 224 may reset the shifted signals based on the enable reset signal RST, and thus, prevent the generation of the enable signal PPREN. When there are four guard keys GK, the enable signal output circuit 224 may generate four shifted signals by sequentially delaying the seed signal four times. When one of the first to fourth enable reset signals RST1 to RST4 is enabled, the enable signal output circuit 224 may prevent the generation of the corresponding shifted signal. For example, when the third enable reset signal RST3 is enabled, the enable signal generation circuit generates the first and second shifted signals, but resets the third shifted signal to prevent the generation of the third and fourth shifted signals. This process will be described below in more detail.

The enable signal output circuit 224 may enable the enable signal PPREN based on the last shifted signal. The enable signal output circuit 224 may further receive the first reset signal PPR_RST1. The enable signal output circuit 224 may disable the enable signal PPREN based on the first reset signal PPR_RST1. The enable signal output circuit 224 may enable the enable signal PPREN when the last shifted signal is enabled, and disable the enable signal PPREN when the first reset signal PPR_RST1 is enabled.

The enable signal output circuit 224 may further generate the second reset signal PPR_RST2. The enable signal output circuit 224 may generate the second reset signal PPR_RST2 based on at least some of the shifted signals. When the seed signal SEED is shifted to generate any one of the plurality of shifted signals, the enable signal output circuit 224 may enable the second reset signal PPR_RST2. The second reset signal PPR_RST2 may be provided to the seed signal generation circuit 221. The seed signal generation circuit 221 may reset the seed signal SEED based on the second reset signal PPR_RST2.

In FIG. 2, the semiconductor apparatus 200 may further include a first reset signal generation circuit 230. The first reset signal generation circuit 230 may receive at least a part of the command signal CA/CS from the command decoding circuit 210, and generate the first reset signal PPR_RST1. For example, the first reset signal generation circuit 230 may generate the first reset signal PPR_RST1 based on the chip select signal CS of the command signal. The chip select signal CS may be inputted to end a specific operation, which is performed by the semiconductor apparatus 200 when the enable signal PPREN is enabled, and the first reset signal generation circuit 230 may enable the first reset signal PPR_RST1 based on the chip select signal CS. The first reset signal PPR_RST1 may be provided to the guard key reset circuit 223 and the enable signal output circuit 224.

Figure 3:
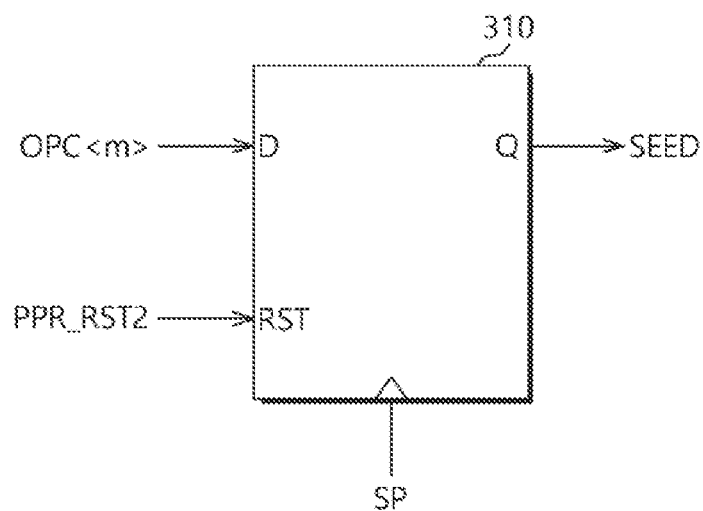
FIG. 3 is a diagram, illustrating a configuration of a seed signal generation circuit, illustrated in FIG. 2.

FIG. 3 illustrates the configuration of the seed signal generation circuit 221, illustrated in FIG. 2. In FIG. 2, the seed signal generation circuit 221 may include a flip-flop 310. The flip-flop 310 may receive the $m^{th}$ bit OPC<m> of the operation code through its input terminal D, and receive the strobe pulse SP through its clock terminal. The flip-flop 310 may receive the second reset signal PPR_RST2 through its reset terminal RST. The seed signal SEED may be outputted through an output terminal Q of the flip-flop 310. The flip-flop 310 may output the $m^{th}$ bit OPC<m> of the operation code as the seed signal SEED based on the strobe pulse SP. When the $m^{th}$ bit OPC<m> of the operation code is at a logic high level (for example, when the strobe pulse SP is enabled), the flip-flop 310 may enable the seed signal SEED to a logic high level. When the flip-flop 310 receives the enabled second reset signal PPR_RST2, the flip-flop 310 may reset the seed signal SEED to a logic low level.

Figure 4:
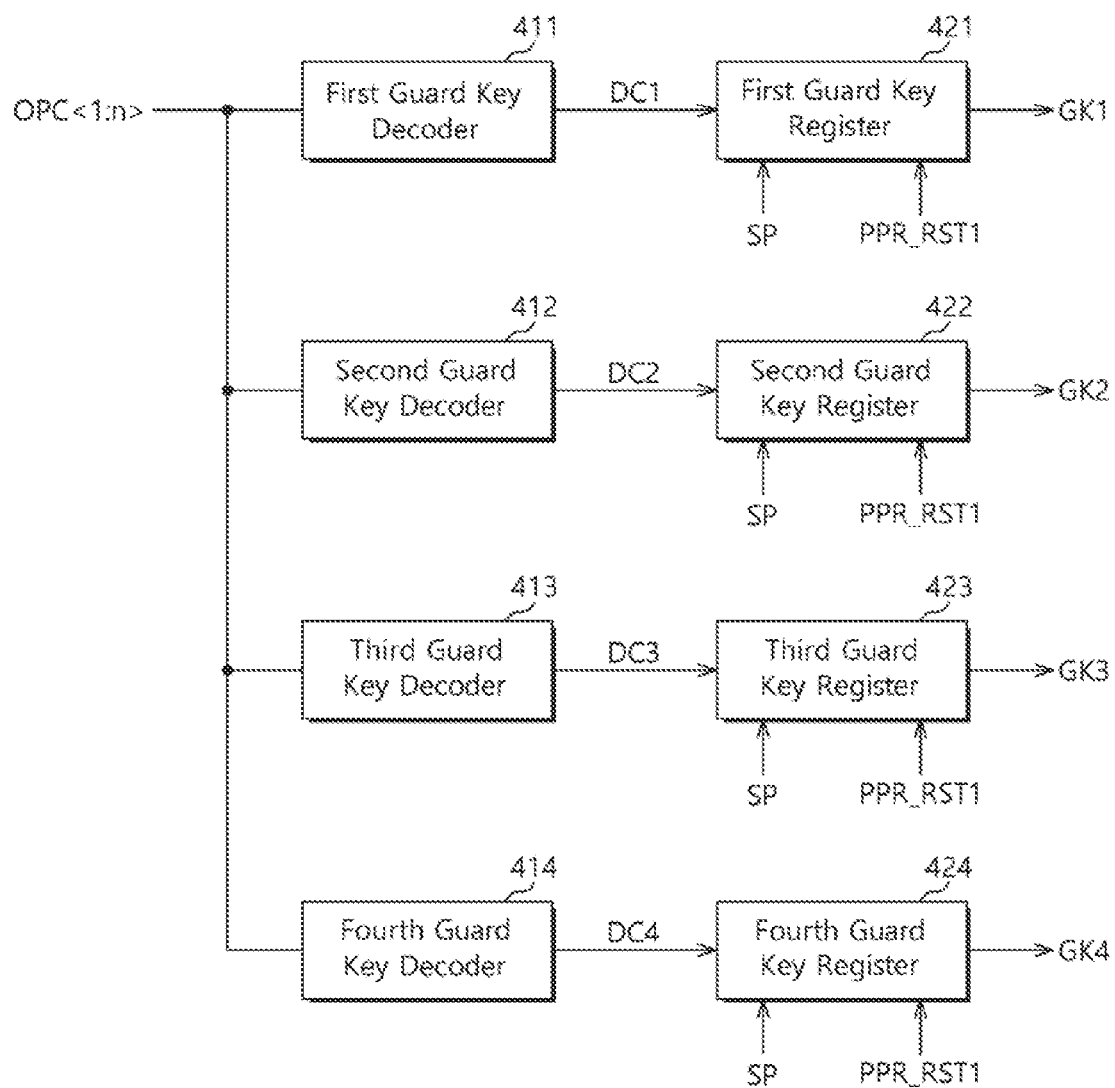
FIG. 4 is a diagram, illustrating a configuration of a guard key generation circuit, illustrated in FIG. 2.

FIG. 4 illustrates the configuration of the guard key generation circuit 222, illustrated in FIG. 2. In FIG. 4, the guard key generation circuit 222 may include a plurality of guard key decoders and a plurality of guard key registers. The number of guard key decoders and the number of guard key registers may correspond to the number of guard keys used by the semiconductor apparatus 200. In FIG. 4, the guard key generation circuit 222 may include first to fourth guard key decoders 411 to 414 and first to fourth guard key registers 421 to 424 based on an embodiment with four guard keys. The first guard key decoder 411 may generate a first decoded signal DC1, by decoding the operation code OPC<1:n>, when the operation code OPC<1:n> has a first code value. The first decoded signal DC1 may be a 1-bit signal, and have a logic high level when the operation code OPC<1:n> has the first code value. The first code value may be an expected value which can enable the first guard key GK1. The second guard key decoder 412 may generate a second decoded signal DC2, by decoding the operation code OPC<1:n>, when the operation code OPC<1:n> has a second code value. The second decoded signal DC2 may be a 1-bit signal, and have a logic high level when the operation code OPC<1:n> has the second code value. The second code value may be an expected value which can enable the second guard key GK2. The third guard key decoder 413 may generate a third decoded signal DC3, by decoding the operation code OPC<1:n>, when the operation code OPC<1:n> has a third code value. The third decoded signal DC3 may be a 1-bit signal, and have a logic high level when the operation code OPC<1:n> has the third code value. The third code value may be an expected value which can enable the third guard key GK3. The fourth guard key decoder 414 may generate a fourth decoded signal DC4, by decoding the operation code OPC<1:n>, when the operation code OPC<1:n> has a fourth code value. The fourth decoded signal DC4 may be a 1-bit signal, and have a logic high level when the operation code OPC<1:n> has the fourth code value. The fourth code value may be an expected value which can enable the fourth guard key GK4.

The first to fourth guard key registers 421 to 424 may receive the same strobe pulse SP. The first guard key register 421 may receive the first decoded signal DC1 from the first guard key decoder 411. When the strobe pulse SP is enabled, the first guard key register 421 may store the first decoded signal DC1, and output the first decoded signal DC1 as the first guard key GK1. The second guard key register 422 may receive the second decoded signal DC2 from the second guard key decoder 412. When the strobe pulse SP is enabled, the second guard key register 422 may store the second decoded signal DC2, and output the second decoded signal DC2 as the second guard key GK2. The third guard key register 423 may receive the third decoded signal DC3 from the third guard key decoder 413. When the strobe pulse SP is enabled, the third guard key register 423 may store the third decoded signal DC3, and output the third decoded signal DC3 as the third guard key GK3. The fourth guard key register 424 may receive the fourth decoded signal DC4 from the fourth guard key decoder 414. When the strobe pulse SP is enabled, the fourth guard key register 424 may store the fourth decoded signal DC4, and output the fourth decoded signal DC4 as the fourth guard key GK4. The first to fourth guard key registers 421 to 424 may receive the same first reset signal PPR_RST1. When the first reset signal PPR_RST1 is enabled, the first to fourth guard key registers 421 to 424 may reset the first to fourth guard keys GK1 to GK4, respectively. For example, when the first rest signal PPR_RST1 is enabled, each of the first to fourth guard key registers 421 to 424 may reset the guard key, stored therein, to a logic high level.

The guard key generation circuit 222 may operate as follows. The first to fourth guard key decoders 411 to 414 may change the logic levels of the first to fourth decoding signals DC1 to DC4 based on the code value of the operation code OPC<1:n>. When the operation code OPC<1:n> has a first code value, the first guard key decoder 411 may output the first decoding signal DC1 with a logic high level, and the second to fourth guard key decoders 412 to 414 may output the second to fourth decoding signals DC2 to DC4 with a logic low level. The first guard key register 421 may store the first decoding signal DC1 in synchronization with the strobe pulse SP and may enable the first guard key GK1 based on the first decoding signal DC1. The second to fourth guard key registers 422 to 424 may store the second to fourth decoding signals DC2 to DC4 and may disable the second to fourth guard keys GK2 to GK4 based on the second to fourth decoding signals DC2 to DC4. When the operation code OPC<1:n> has a second code value, the second guard key decoder 412 may output the second decoding signal DC2 with a logic high level, and the first, third and fourth guard key decoders 411, 413 and 414 may output the first, third and fourth decoding signals DC1, DC3, and DC4 with a logic low level. The second guard key register 422 may store the second decoding signal DC2 in synchronization with the strobe pulse SP and may enable the second guard key GK2 based on the second decoding signal DC2. The first, third and fourth guard key registers 421, 423, and 424 may store the first, third, and fourth decoding signals DC1, DC3, and DC4, and disable the first, third, and fourth guard keys GK1, GK3, and GK4 based on the first, third, and fourth decoding signals DC1, DC3, and DC4. When the operation code OPC<1:n> has a third code value, the third guard key decoder 413 may output the third decoding signal DC3 with a logic high level, and the first, second and fourth guard key decoder 411, 412 and 414 may output the first, second, and fourth decoding signals DC1, DC2, and DC4 with a logic low level. The third guard key decoder 413 may store the third decoding signal DC3 in synchronization with the strobe pulse SP and may enable the third guard key GK3 based on the third decoding signal DC3. The first, second, and fourth guard key registers 421, 422, and 424 may store the first, second, and fourth decoding signals DC1, DC2, and DC4, and disable the first, second, and fourth guard keys GK1, GK2, and GK4 based on the first, second, and fourth decoding signals DC1, DC2, and DC4. When the operation code OPC<1:n> has a fourth code value, the fourth guard key decoder 414 may output the fourth decoding signal DC4 with a logic high level, and the first to third guard key decoders 411 to 413 may output the first to third decoding signals DC1 to DC3 with a logic low level. The fourth guard key register 424 may store the fourth decoding signal DC4 in synchronization with the strobe pulse SP and may enable the fourth guard key GK4 based on the fourth decoding signal DC4. The first to third guard key registers 421 to 423 may store the first to third decoding signals DC1 to DC3 and may disable the first to third guard keys GK1 to GK3 based on the first to third decoding signals DC1 to DC3. The guard key generation circuit 222 may sequentially enable the first to fourth guard keys GK1 to GK4 when the operation codes OPC<1:n> with the fourth to fourth code values are sequentially inputted. Therefore, when at least one operation code OPC<1:n>, which does not correspond to an expected value, is inputted, the first to fourth guard keys GK1 to GK4 may not be sequentially enabled.

Figure 5:
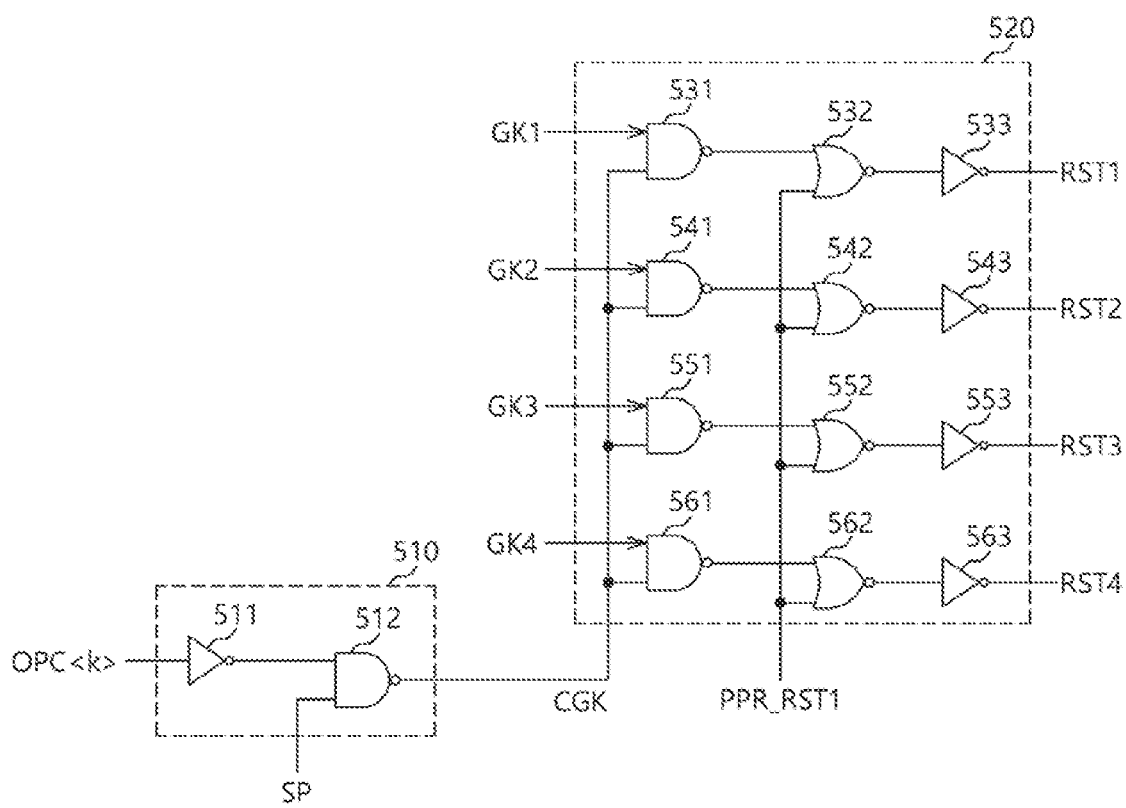
FIG. 5 is a diagram, illustrating a configuration of a guard key reset circuit, illustrated in FIG. 2.

FIG. 5 illustrates the configuration of the guard key reset circuit 223, illustrated in FIG. 2. In FIG. 4, the guard key reset circuit 223 may include a common guard key generator 510 and an enable reset signal generator 520. The common guard key generator 510 may generate a common guard key CGK based on the $k^{th}$ bit OPC<k> of the operation code and the strobe pulse SP. The common guard key generator 510 may output the $k^{th}$ bit OPC<k> of the operation code as the common guard key CGK whenever the strobe pulse SP is enabled. The common guard key generator 510 may output the $k^{th}$ bits OPC<k> of the first to fourth operation codes as the common guard key CGK whenever the strobe pulse SP is enabled. The common guard key generator 510 may include an inverter 511 and a NAND gate 512. The inverter 511 may receive the $k^{th}$ bit OPC<k> of the operation code, and invert the $k^{th}$ bit OPC<k> of the operation code. The NAND gate 512 may receive an output of the inverter 511 and the strobe pulse SP. When the strobe pulse SP is enabled to a high level, the NAND gate 512 may invert the output of the inverter 511 and output the common guard key CGK.

The enable reset signal generator 520 may receive the guard keys GK1 to GK4 and the common guard key CGK. The enable reset signal generator 520 may generate the enable reset signals RST1 to RST4, based on the guard keys GK1 to GK4 and the common guard key CGK. The enable reset signal generator 520 may generate the first enable reset signal RST1 based on the common guard key CGK and the first guard key GK1. The enable reset signal generator 520 may generate the second enable reset signal RST2 based on the common guard key CGK and the second guard key GK2. The enable reset signal generator 520 may generate the third enable reset signal RST3 based on the common guard key CGK and the third guard key GK3. The enable reset signal generator 520 may generate the fourth enable reset signal RST4 based on the common guard key CGK and the fourth guard key GK4. The enable reset signal generator 520 may further receive the first reset signal PPR_RST1. When the first reset signal PPR_RST1 is enabled, the enable reset signal generator 520 may enable the enable reset signals RST1 to RST4 regardless of the guard keys GK1 to GK4.

The enable reset signal generator 520 may include a first NAND gate 531, a first NOR gate 532, a first inverter 533, a second NAND gate 541, a second NOR gate 542, a second inverter 543, a third NAND gate 551, a third NOR gate 552, a third inverter 553, a fourth NAND gate 561, a fourth NOR gate 562 and a fourth inverter 563. The first NAND gate 531 may receive the common guard key CGK and the first guard key GK1. The first NOR gate 532 may receive an output of the first NAND gate 531 and the first reset signal PPR_RST1. The first inverter 533 may invert an output of the first NOR gate 532, and output the first enable reset signal RST1. The second NAND gate 541 may receive the common guard key CGK and the second guard key GK2. The second NOR gate 542 may receive an output of the second NAND gate 541 and the first reset signal PPR_RST1. The second inverter 543 may invert an output of the second NOR gate 542, and output the second enable reset signal RST2. The third NAND gate 551 may receive the common guard key CGK and the third guard key GK3. The third NOR gate 552 may receive an output of the third NAND gate 551 and the first reset signal PPR_RST1. The third inverter 553 may invert an output of the third NOR gate 552, and output the third enable reset signal RST3. The fourth NAND gate 561 may receive the common guard key CGK and the fourth guard key GK4. The fourth NOR gate 562 may receive an output of the fourth NAND gate 561 and the first reset signal PPR_RST1. The fourth inverter 563 may invert an output of the fourth NOR gate 562, and output the fourth enable reset signal RST4.

When the strobe pulse SP is enabled for the first time, the common guard key GCK, generated from the first operation code OPC<1:n> and the first guard key GK1, may be inputted to the enable reset signal generator 520. When both of the common guard key CGK and the first guard key GK1 are at a logic high level, the enable reset signal generator 520 may retain the first enable reset signal RST1 in a disabled state. When the logic levels of the common guard key CGK and the first guard key GK1 are different from each other, the enable reset signal generator 520 may enable the first enable reset signal RST1. When the strobe pulse SP is enabled for the second time, the common guard key GCK generated from the second operation code OPC<1:n> and the second guard key GK2 may be inputted to the enable reset signal generator 520. When both of the common guard key CGK and the second guard key GK2 are at a logic high level, the enable reset signal generator 520 may retain the second enable reset signal RST2 in a disabled state. When the logic levels of the common guard key CGK and the second guard key GK2 are different from each other, the enable reset signal generator 520 may enable the second enable reset signal RST2. When the strobe pulse SP is enabled for the third time, the common guard key GCK generated from the third operation code OPC<1:n> and the third guard key GK3 may be inputted to the enable reset signal generator 520.

When both of the common guard key CGK and the third guard key GK3 are at a logic high level, the enable reset signal generator 520 may retain the third enable reset signal RST3 in a disabled state. When the logic levels of the common guard key CGK and the third guard key GK3 are different from each other, the enable reset signal generator 520 may enable the third enable reset signal RST3. When the strobe pulse SP is enabled for the fourth time, the common guard key GCK generated from the fourth operation code OPC<1:n> and the fourth guard key GK4 may be inputted to the enable reset signal generator 520. When both of the common guard key CGK and the fourth guard key GK4 are at a logic high level, the enable reset signal generator 520 may retain the fourth enable reset signal RST4 in a disabled state. When the logic levels of the common guard key CGK and the fourth guard key GK4 are different from each other, the enable reset signal generator 520 may enable the fourth enable reset signal RST4.

Figure 6:
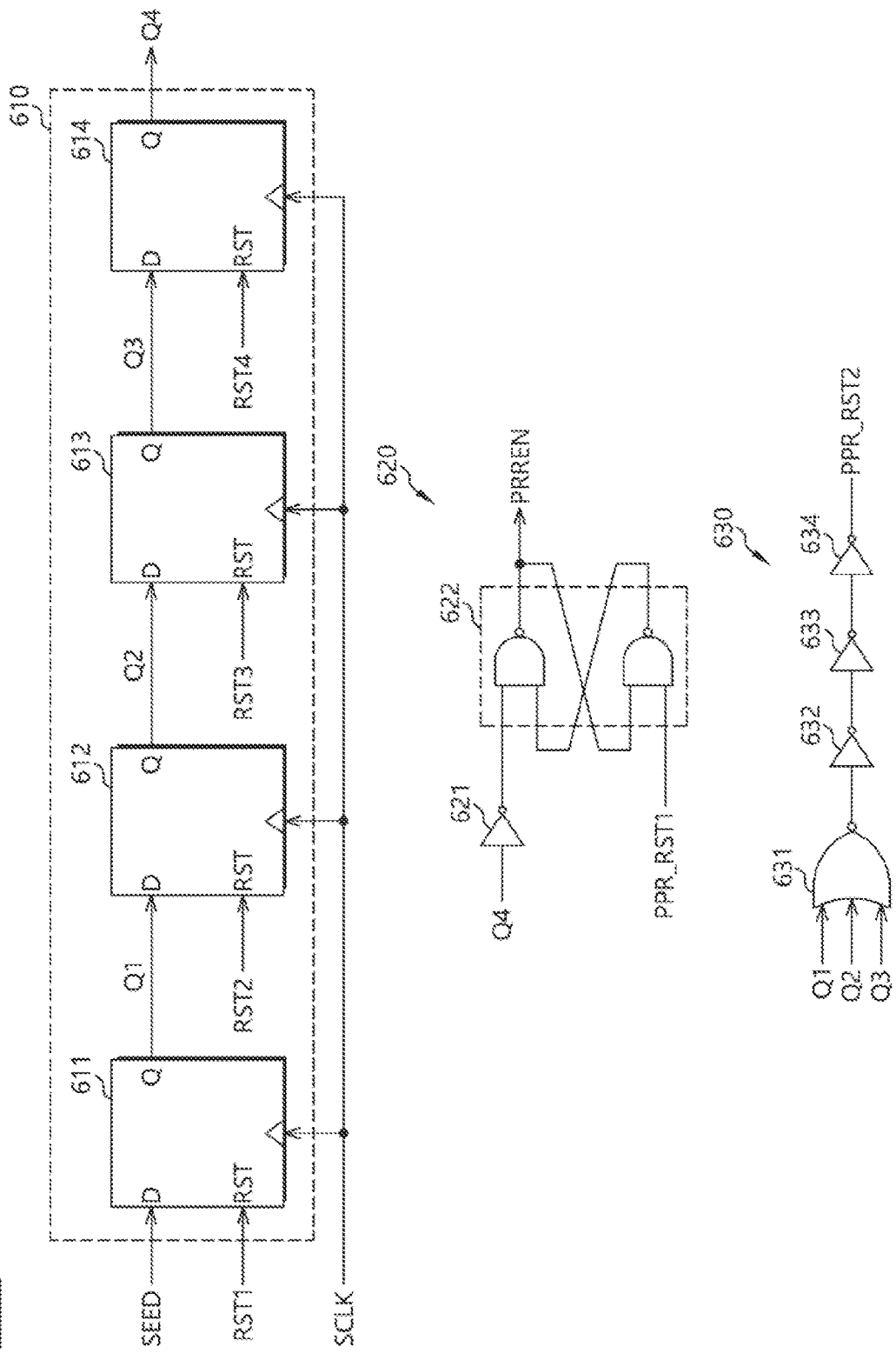
FIG. 6 is a diagram, illustrating a configuration of an enable signal output circuit, illustrated in FIG. 2.

FIG. 6 illustrates the configuration of the enable signal output circuit 224, illustrated in FIG. 2. In FIG. 6, the enable signal output circuit 224 may include a shift register circuit 610, a latch circuit 620 and a second reset signal generation circuit 630. The shift register circuit 610 may receive the seed signal SEED, the shifting clock signal SCLK, and shift the seed signal SEED. The shift register circuit 610 may generate a plurality of shifted signals by shifting the seed signal SEED. Whenever the shifting clock signal SCLK toggles, the shift register circuit 610 may generate the plurality of shifted signals by shifting the seed signal SEED. For example, when the number of the guard keys is four, the shift register circuit 610 may generate first to fourth shifted signals Q1 to Q4 by shifting the seed signal SEED four times. The shift register circuit 610 may reset the first to fourth shifted signals Q1 to Q4 based on the first to fourth enable reset signals RST1 to RST4, respectively. The shift register circuit 610 may include a first flip-flop 611, a second flip-flop 612, a third flip-flop 613 and a fourth flip-flop 614. The first flip-flop 611 may receive the seed signal SEED through its input terminal D, and receive the shifting clock signal SCLK through its clock terminal. The first shifted signal Q1 may be outputted from an output terminal Q of the first flip-flop 611. The first flip-flop 611 may receive the first enable reset signal RST1 through its reset terminal RST. When the first enable reset signal RST1 is enabled, the first flip-flop 611 may reset the first shifted signal Q1 to prevent the generation of the first shifted signal Q1 from the seed signal SEED.

The second flip-flop 612 may receive the first shifted signal Q1 through its input terminal D, and receive the shifting clock signal SCLK through its clock terminal. The second shifted signal Q2 may be outputted from an output terminal Q of the second flip-flop 612. The second flip-flop 612 may receive the second enable reset signal RST2 through its reset terminal RST. When the second enable reset signal RST2 is enabled, the second flip-flop 612 may reset the second shifted signal Q2 to prevent the generation of the second shifted signal Q2 from the first shifted signal Q1.

The third flip-flop 613 may receive the second shifted signal Q2 through its input terminal D, and receive the shifting clock signal SCLK through its clock terminal. The third shifted signal Q3 may be outputted from an output terminal Q of the third flip-flop 613. The third flip-flop 613 may receive the third enable reset signal RST3 through its reset terminal RST. When the third enable reset signal RST3 is enabled, the third flip-flop 613 may reset the third shifted signal Q3 to prevent the generation of the third shifted signal Q3 from the second shifted signal Q2.

The fourth flip-flop 614 may receive the third shifted signal Q3 through its input terminal D, and receive the shifting clock signal SCLK through its clock terminal. The fourth shifted signal Q4 may be outputted from an output terminal Q of the fourth flip-flop 614. The fourth flip-flop 614 may receive the fourth enable reset signal RST4 through its reset terminal RST. When the fourth enable reset signal RST4 is enabled, the fourth flip-flop 614 may reset the fourth shifted signal Q4 to prevent the generation of the fourth shifted signal Q4 from the third shifted signal Q3.

The latch circuit 620 may receive the last of the shifted signals, generated from the shift register circuit 610. The latch circuit 620 may generate the enable signal PPREN based on the fourth shifted signal Q4. The latch circuit 620 may enable the enable signal PPREN when the fourth shifted signal Q4 is enabled. The latch circuit 620 may further receive the first reset signal PPR_RST1. The latch circuit 620 may disable the enable signal PPREN when the first reset signal PPR_RST1 is enabled. The latch circuit 620 may include an inverter 621 and an SR latch 622. The inverter 621 may receive the fourth shifted signal Q4. The inverter 621 may invert the fourth shifted signal Q4. The SR latch 622 may receive an output of the inverter 621 and the first reset signal PPR_RST1. The SR latch 622 may enable the enable signal PPREN based on the output of the inverter 621, and disable the enable signal PPREN when the first reset signal PPR_RST1 is enabled. Since the latch circuit 620 enables the enable signal PPREN based on the last shifted signal, the latch circuit 620 may enable the enable signal PPREN based on the fourth shifted signal Q4, generated from the seed signal SEED, when none of the first to fourth enable reset signals RST1 to RST4 are enabled.

The second reset signal generation circuit 630 may receive of the remaining shifted signals. However, the invention is not limited thereto as the number of shifted signals, received by the second reset signal generation circuit 630, may differ. For example, the second reset signal generation circuit 630 may receive one or more of the shifted signals. The second reset signal generation circuit 630 may receive the remaining shifted signals and generate the second reset signal PPR_RST2. When any one of the plurality of shifted signals is enabled, the second reset signal generation circuit 630 may enable the second reset signal PPR_RST2. The second reset signal PPR_RST2 may be provided to the seed signal generation circuit 221. The second reset signal generation circuit 630 may include a NOR gate 631, a first inverter 632, a second inverter 633 and a third inverter 634. The NOR gate 631 may receive the first to third shifted signals Q1 to Q3. The first to third inverters 632 to 634 may generate the second reset signal PPR_RST2 by sequentially inverting an output of the NOR gate 631. Therefore, the second reset signal generation circuit 630 may generate the second reset signal PPR_RST2, which is enabled to a logic high level, when any one of the first to third shifted signals Q1 to Q3 is enabled to a logic high level.

Referring to FIGS. 2 to 6, the operations of the enable signal generation circuit 220 and the semiconductor apparatus 200, including the same, in accordance with the present embodiment, will be described as follows. The command decoding circuit 210 may generate the operation code OPC<1:n> based on the input command signal CA/CS. When the $m^{th}$ bit OPC<m> of the operation code, generated based on the command signal CA/CS, is at a low level, the seed signal generation circuit 221 might not generate the seed signal SEED, and the operation of generating the enable signal PPREN might not be performed. When the $m^{th}$ bit OPC<m> of the operation code, generated based on the command signal CA/CS, is at a high level, the seed signal generation circuit 221 may enable the seed signal SEED in synchronization with the strobe pulse SP.

The operation code OPC<1:n>, which is generated based on the input command signal CA/CS after the seed signal SEED is generated, may be the first operation code to generate the first guard key GK1. The guard key generation circuit 222 may generate the first guard key GK1 by decoding the first operation code OPC<1:n>. When the first operation code OPC<1:n> corresponds to an expected value, the first guard key GK1 may have a logic high level, and the guard key reset circuit 223 may retain the first enable reset signal RST1 in a disabled state. Therefore, the enable signal output circuit 224 may output the seed signal SEED as the first shifted signal Q1 in synchronization with the shifting clock signal SCLK.

The operation code OPC<1:n>, which is generated based on the command signal CA/CS, which is subsequently inputted, may be the second operation code to generate the second guard key GK2. The guard key generation circuit 222 may generate the second guard key GK2 by decoding the second operation code OPC<1:n>. When the second operation code OPC<1:n> corresponds to an expected value, the second guard key GK2 may have a logic high level, and the guard key reset circuit 223 may retain the second enable reset signal RST2 in a disabled state. Therefore, the enable signal output circuit 224 may output the first shifted signal Q1 as the second shifted signal Q2 in synchronization with the shifting clock signal SCLK.

The operation code OPC<1:n>, which is generated based on the command signal CA/CS, which is subsequently inputted, may be the third operation code to generate the third guard key GK3. The guard key generation circuit 222 may generate the third guard key GK3 by decoding the third operation code OPC<1:n>. When the third operation code OPC<1:n> corresponds to an expected value, the third guard key GK3 may have a logic high level, and the guard key reset circuit 223 may retain the third enable reset signal RST3 in a disabled state. Therefore, the enable signal output circuit 224 may output the second shifted signal Q2 as the third shifted signal Q3 in synchronization with the shifting clock signal SCLK.

The operation code OPC<1:n>, which is generated based on the command signal CA/CS, which is subsequently inputted, may be the fourth operation code. The guard key generation circuit 222 may generate the fourth guard key GK4 by decoding the fourth operation code OPC<1:n>. When the fourth operation code OPC<1:n> corresponds to an expected value, the fourth guard key GK4 may have a logic high level, and the guard key reset circuit 223 may retain the fourth enable reset signal RST4 in a disabled state. Therefore, the enable signal output circuit 224 may output the third shifted signal Q3 as the fourth shifted signal Q4 in synchronization with the shifting clock signal SCLK.

Is [0063] The enable signal output circuit 224 may enable the enable signal PPREN based on the fourth shifted signal Q4. Therefore, when the command signals CA/CS, capable of generating the first to fourth operation codes OPC<1:n>, corresponding to the expected values, are successively received, the enable signal generation circuit 220 may enable the enable signal PPREN.

When one of the first to fourth guard keys GK1 to GK4, generated from the first to fourth operation codes, has a logic low level, one of the first to fourth enable reset signals RST1 to RST4 may be enabled. When the first to fourth enable reset signals RST1 to RST4 are enabled, the enable signal output circuit 224 may prevent the generation of the first to fourth shifted signals Q1 to Q4 so that the enable signal PPREN is not enabled.

When any one of the first to third shifted signals Q1 to Q3 is enabled, the enable signal output circuit 224 may generate the second reset signal PPR_RST2, and the seed signal generation circuit 221 may reset the seed signal SEED to a logic low level. The semiconductor apparatus 200 may perform a specific operation based on the enable signal PPREN. Then, when the command signal CA/CS is inputted to end the specific operation of the semiconductor apparatus 200, the first reset signal generation circuit 230 may enable the first reset signal PPR_RST1 based on the command signal CA/CS. When the first reset signal PPR_RST1 is enabled, the guard key reset circuit 223 may enable the first to fourth enable reset signals RST1 to RST4 to reset the first to fourth guard keys GK1 to GK4. The enable signal output circuit 224 may disable the enable signal PPREN based on the first reset signal PPR_RST1.

Figure 7:
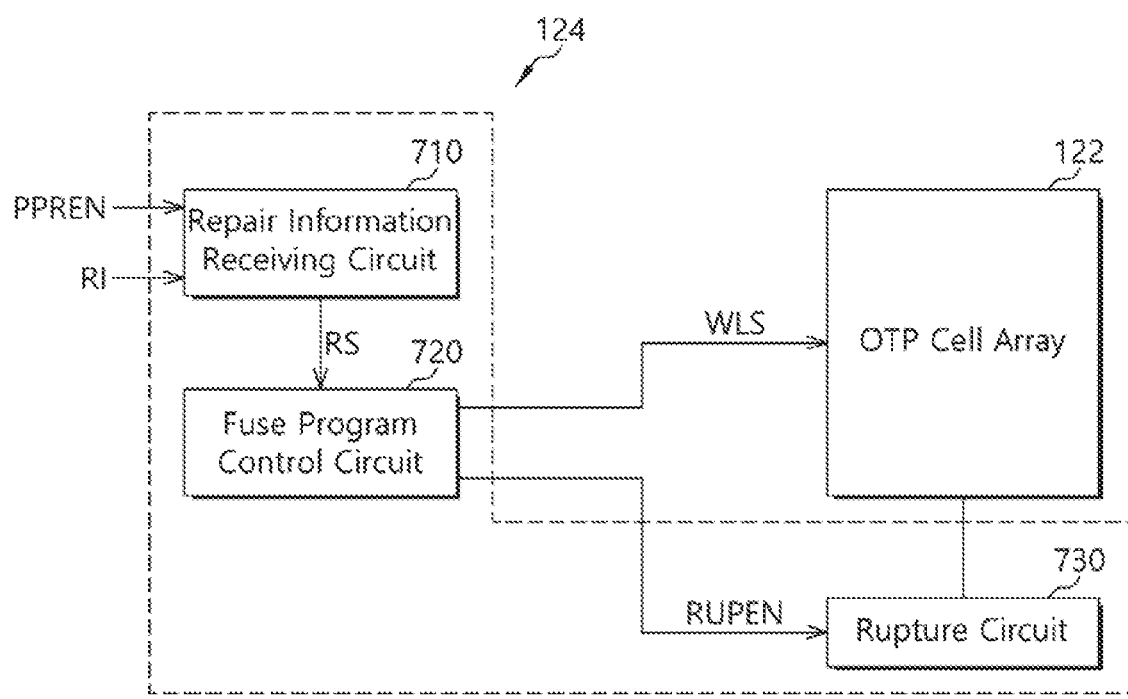
FIG. 7 is a diagram, illustrating a configuration of a repair circuit, illustrated in FIG. 1.

FIG. 7 illustrates the configuration of the repair circuit 124 and the OTP cell array 122, which are illustrated in FIG. 1. In FIG. 7, the repair circuit 124 may include a repair information receiving circuit 710, a fuse program control circuit 720, and a rupture circuit 730. The repair information receiving circuit 710 may receive the enable signal PPREN and repair information RI. When the enable signal PPREN is enabled, the repair information receiving circuit 710 may generate a repair control signal RS based on the repair information RI. The fuse program control circuit 720 may generate a word line select signal WLS to select a specific word line, among the word lines of the OTP cell array 122, based on the repair control signal RS. The fuse program control circuit 720 may select a specific bit line, among the bit lines of the OTP cell array 122, based on the repair control signal RS, and generate a rupture enable signal RUPEN to program an OTP memory cell, coupled to the selected word line and the selected bit line. The rupture circuit 730 may program the OTP memory cell by rupturing the selected OPT memory cell based on the rupture enable signal RUPEN.

Figure 8:
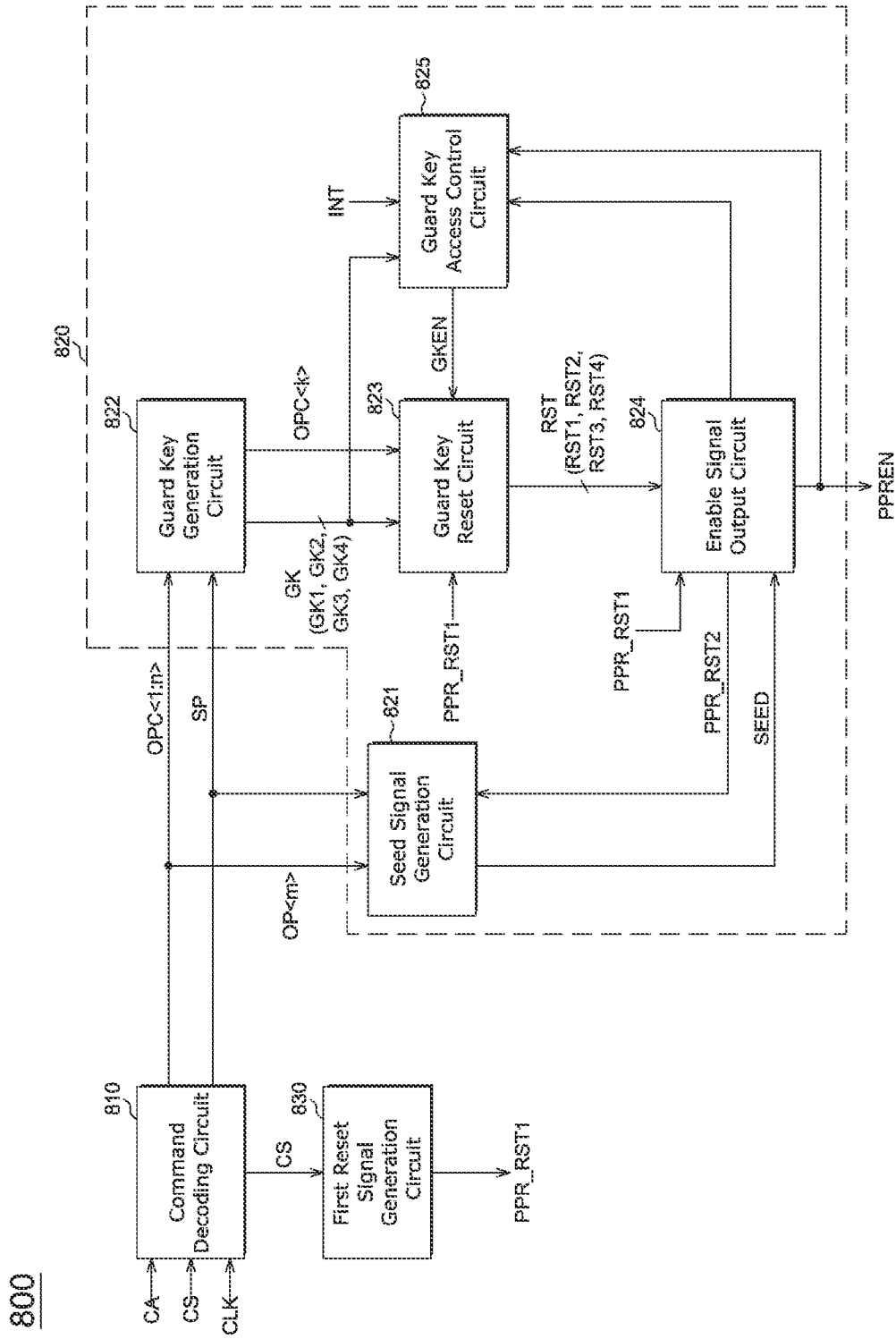
FIG. 8 is a diagram illustrating a configuration of a semiconductor apparatus in accordance with an embodiment.

FIG. 8 is a diagram illustrating a configuration of a semiconductor apparatus 800 in accordance with an embodiment. Referring to FIG. 8, the semiconductor apparatus 800 may include a command decoding circuit 810 and an enable signal generation circuit 820. The enable signal generation circuit 820 may be applied as the enable signal generation circuit 123 as illustrated in FIG. 1. The semiconductor apparatus 800 may include the same components as those of the semiconductor apparatus 200 as illustrated in FIG. 2. Hereafter, overlapping descriptions of the same components have been omitted. The command decoding circuit 810 may receive a command address signal CA, a chip select signal CS, and a clock signal CLK and may generate an operation code OPC<1:n> and a strobe pulse SP based on the command address signal CA, the chip select signal CS, and the clock signal CLK.

The enable signal generation circuit 820 may generate a seed signal SEED based on the strobe pulse SP and at least a part of the operation code OPC<1:n>. The enable signal generation circuit 820 may generate the seed signal SEED based on an $m^{th}$ bit OPC<m> of the operation code OPC<1:n> and the strobe pulse SP. For example, when the $m^{th}$ bit OPC<m> of the operation code OPC<1:n> has a logic high level, the enable signal generation circuit 820 may enable the seed signal SEED in synchronization with the strobe pulse SP. The enable signal generation circuit 820 may generate an enable signal PPERN based on the operation code OPC<1:n>, the strobe pulse SP, and the seed signal SEED. After the seed signal SEED is enabled, the enable signal generation circuit 820 may generate a plurality of guard keys GK from the plurality of operation codes OPC<1:n>. When the plurality of operation codes OPC<1: n> correspond to expected values, respectively, the enable signal generation circuit 820 may enable the plurality of guard keys GK, respectively. When the plurality of operation codes OPC<1:n> are different from the expected values, respectively, the enable signal generation circuit 820 may disable the plurality of guard keys GK, respectively. When the plurality of guard keys GK are sequentially enabled, the enable signal generation circuit 820 may generate a plurality of shifting signals by shifting the seed signal SEED and may enable the enable signal PPREN. When any one of the plurality of operation codes OPC<1:n> is different from the corresponding expected value, the enable signal generation circuit 820 may disable the guard key GK that corresponds to the operation code OPC<1:n> and may enable an enable reset signal RST, thereby preventing the generation of the enable signal PPREN.

When one or more of the plurality of guard keys GK are not sequentially enabled, the enable signal generation circuit 820 may enable the enable reset signal RST for a predetermined time. The enable signal generation circuit 820 may prevent the generation of the enable signal PPREN based on the guard key GK for the predetermined time. When any one of the plurality of guard keys GK is not sequentially enabled, the enable signal generation circuit 820 may prevent the generation of the enable signal PPREN through the plurality of guard keys GK for the predetermined time, thereby strengthening the security disabling method for generating the enable signal PPREN based on the guard keys GK. That is, after the predetermined time, the enable signal generation circuit 820 may generate the enable signal PPREN only when the plurality of operation codes OPC<1:n> that correspond to the expected values are inputted.

In an embodiment, the enable signal generation circuit 820 may further receive a first reset signal PPR_RST1. The enable signal generation circuit 820 may generate the enable reset signal RST based on the first reset signal PPR_RST1. When the first reset signal PPR_RST1 is enabled, the enable signal generation circuit 820 may enable the enable reset signal RST regardless of the guard key GK. In an embodiment, the enable signal generation circuit 820 may generate a second reset signal PPR_RST2 based on the guard key GK and the enable reset signal RST. The enable signal generation circuit 820 may reset the seed signal SEED based on the second reset signal PPR_RST2.

The enable signal generation circuit 820 may include a seed signal generation circuit 821, a guard key generation circuit 822, a guard key reset circuit 823, and an enable signal output circuit 824. Additionally, the enable signal generation circuit 820 may include a guard key access control circuit 825. The seed signal generation circuit 821, the guard key generation circuit 822, and the enable signal output circuit 824 may have substantially the same configurations as the seed signal generation circuit 221, the guard key generation circuit 222, and the enable signal output circuit 224, and may perform substantially the same functions as the seed signal generation circuit 221, the guard key generation circuit 222, and the enable signal output circuit 224. The guard key reset circuit 823 may generate the plurality of enable reset signals RST based on the plurality of guard keys GK and a guard key enable signal GKEN. The guard key reset circuit 823 may allow the enable signal output circuit 824 to generate the enable signal PPREN based on the plurality of guard keys GK when the guard key enable signal GKEN is enabled and may prevent the generation of the enable signal PPREN when the guard key enable signal GKEN is disabled. For example, the guard key reset circuit 823 may generate first to fourth enable reset signals RST1 to RST4 based on first to fourth guard keys GK1 to GK4 and the guard key enable signal GKEN. When the first to fourth guard keys GK1 to GK4 are enabled to a logic high level while the guard key enable signal GKEN is enabled, the guard key reset circuit 823 may retain the first to fourth enable reset signals RST1 to RST4 in a disabled state. The guard key reset circuit 823 may enable one or more of the first to fourth enable reset signals RST1 to RST4 when the guard key enable signal GKEN is disabled or when one or more of the first to fourth guard keys GK1 to GK4 are disabled to a logic low level. The guard key reset circuit 823 may generate the first enable reset signal RST1 based on the first guard key GK1 and the guard key enable signal GKEN and may generate the second enable reset signal RST2 based on the second guard key GK2 and the guard key enable signal GKEN. The guard key reset circuit 823 may generate the third enable reset signal RST3 based on the third guard key GK3 and the guard key enable signal GKEN and may generate the fourth enable reset signal RST4 based on the fourth guard key GK4 and the guard key enable signal GKEN.

The guard key reset circuit 823 may further receive the first reset signal PPR_RST1. The guard key reset circuit 823 may enable the enable reset signal RST based on the first reset signal PPR_RST1. When the first reset signal PPR_RST1 is enabled, the guard key reset circuit 823 may enable all of the first to fourth enable reset signals RST1 to RST4 regardless of the first to fourth guard keys GK1 to GK4.

The guard key access control circuit 825 may generate the guard key enable signal GKEN based on the plurality of guard keys GK. The guard key access control circuit 825 may detect a guard key fail when any one of the plurality of guard keys GK is not sequentially enabled and may retain the guard key enable signal GKEN in a disabled state for a predetermined time. The guard key access control circuit 825 may receive an initialization signal INT to define the predetermined time. The initialization signal INT may be inputted from the outside for the sake of a power-up operation and boot-up operation of the semiconductor apparatus 800. The initialization signal INT may be inputted to the semiconductor apparatus 800 through a pin or pad that is provided separately from a pin or pad for receiving the command address signal CA. In an embodiment, the initialization signal INT may be generated by the command decoding circuit 810 based on the command address signal CA and the chip select signal CS. In an embodiment, the guard key access control circuit 825 may define the predetermined time without receiving the initialization signal INT. The guard key access control circuit 825 may disable the guard key enable signal GKEN when any one of the plurality of guard keys GK is not sequentially enabled. Then, the guard key access control circuit 825 may autonomously detect that the predetermined time has passed and may enable the guard key enable signal GKEN again. The guard key access control circuit 825 may receive the seed signal SEED and at least some of the plurality of shifting signals that are generated by the enable signal output circuit 824 in order to generate the guard key enable signal GKEN by detecting whether the plurality of guard keys GK are enabled. More details of the configuration will be described below. The guard key access control circuit 825 may further receive the enable signal PPREN that is generated by the enable signal output circuit 824. When the enable signal PPREN is enabled, the guard key access control circuit 825 might not detect a guard key fail, but retain the guard key enable signal GKEN in an enabled state.

The semiconductor apparatus 800 may further include a first reset signal generation circuit 830. The first reset signal generation circuit 830 may have substantially the same configuration as the first reset signal generation circuit 230 that is illustrated in FIG. 2 and may perform substantially the same function as the first reset signal generation circuit 230.

Figure 9:
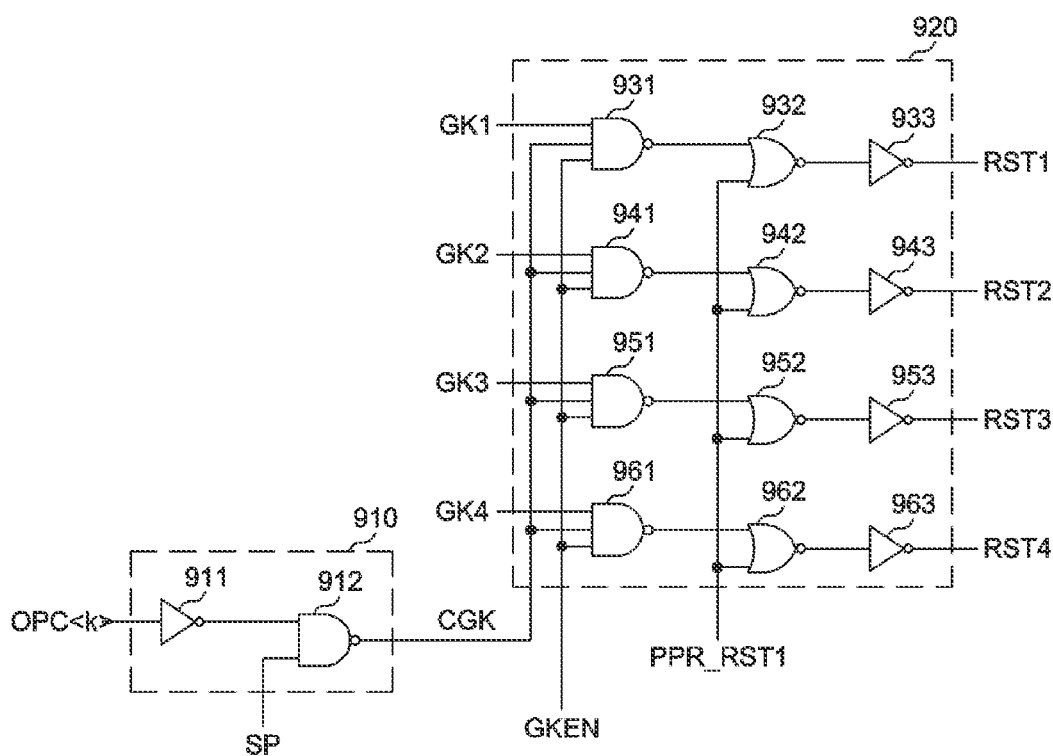
FIG. 9 is a diagram illustrating a configuration of a guard key reset circuit illustrated in FIG. 8.

FIG. 9 is a diagram illustrating a configuration of the guard key reset circuit illustrated in FIG. 8. Referring to FIG. 9, the guard key reset circuit 823 may include a common guard key generator 910 and an enable reset signal generator 920. The common guard key generator 910 may generate a common guard key CGK based on the $k^{th}$ bit OPC<k> of the operation code and the strobe pulse SP. The common guard key generator 910 may output the $k^{th}$ bit OPC<k> of the operation code as the common guard key CGK whenever the strobe pulse SP is enabled. The common guard key generator 910 may output each of the k bits OPC<k> of the first to fourth operation codes as the common guard key CGK whenever the strobe pulse SP is enabled. The common guard key generator 910 may include an inverter 911 and a NAND gate 912. The inverter 911 may receive the $k^{th}$ bit OPC<k> of the operation code and may invert the $k^{th}$ bit OPC<k> of the operation code. The NAND gate 912 may receive an output of the inverter 911 and the strobe pulse SP. When the strobe pulse SP is enabled to a logic high level, the NAND gate 912 may invert the output of the inverter 911 and may output the common guard key CGK.

The enable reset signal generator 920 may receive the guard keys GK1 to GK4, the common guard key CGK, and the guard key enable signal GKEN. The enable reset signal generator 920 may generate the enable reset signals RST1 to RST4 based on the guard keys GK1 to GK4, the common guard key CGK, and the guard key enable signal GKEN. The enable reset signal generator 920 may generate the first enable reset signal RST1 based on the common guard key CGK, the first guard key GK1, and the guard key enable signal GKEN. The enable reset signal generator 920 may generate the second enable reset signal RST2 based on the common guard key CGK, the second guard key GK2, and the guard key enable signal GKEN. The enable reset signal generator 920 may generate the third enable reset signal RST3 based on the common guard key CGK, the third guard key GK3, and the guard key enable signal GKEN. The enable reset signal generator 920 may generate the fourth enable reset signal RST4 based on the common guard key CGK, the fourth guard key GK4, and the guard key enable signal GKEN. The enable reset signal generator 920 may further receive the first reset signal PPR_RST1. When the first reset signal PPR_RST1 is enabled, the enable reset signal generator 920 may enable the first to fourth enable reset signals RST1 to RST4 regardless of the first to fourth guard keys GK1 to GK4.

The enable reset signal generator 920 may include a first NAND gate 931, a first NOR gate 932, a first inverter 933, a second NAND gate 941, a second NOR gate 942, a second inverter 943, a third NAND gate 951, a third NOR gate 952, a third inverter 953, a fourth NAND gate 961, a fourth NOR gate 962, and a fourth inverter 963. The first NAND gate 931 may receive the common guard key CGK, the first guard key GK1, and the guard key enable signal GKEN. The first NOR gate 932 may receive an output of the first NAND gate 931 and the first reset signal PPR_RST1. The first inverter 933 may invert an output of the first NOR gate 932 and may output the inverted signal as the first enable reset signal RST1. Therefore, when the guard key enable signal GKEN is disabled to a logic low level, the enable reset signal generator 920 may enable the first enable reset signal RST1 to a logic high level regardless of the logic levels of the common guard key CGK and the first guard key GK1. When the guard key enable signal GKEN is enabled to a logic high level, the enable reset signal generator 920 may generate the first enable reset signal RST1 by comparing the logic levels of the common guard key CGK to the first guard key GK1. The enable reset signal generator 920 may retain the first enable reset signal RST1 in a disabled state when both of the common guard key CGK and the first guard key GK1 are at a logic high level and may enable the first enable reset signal RST1 to a logic high level when the logic levels of the common guard key CGK and the first guard key GK1 are different from each other.

The second NAND gate 941 may receive the common guard key CGK, the second guard key GK2, and the guard key enable signal GKEN. The second NOR gate 942 may receive an output of the second NAND gate 941 and the first reset signal PPR_RST1. The second inverter 943 may invert an output of the second NOR gate 942 and may output the inverted signal as the second enable reset signal RST2. Therefore, when the guard key enable signal GKEN is disabled to a logic low level, the enable reset signal generator 920 may enable the second enable reset signal RST2 to a logic high level regardless of the logic levels of the common guard key CGK and the second guard key GK2. When the guard key enable signal GKEN is enabled to a logic high level, the enable reset signal generator 920 may generate the second enable reset signal RST2 by comparing the logic levels of the common guard key CGK and the second guard key GK2. The enable reset signal generator 920 may retain the second enable reset signal RST2 in a disabled state when both of the common guard key CGK and the second guard key GK2 are at a logic high level and may enable the second enable reset signal RST2 to a logic high level when the logic levels of the common guard key CGK and the second guard key GK2 are different from each other.

The third NAND gate 951 may receive the common guard key CGK, the third guard key GK3, and the guard key enable signal GKEN. The third NOR gate 952 may receive an output of the third NAND gate 951 and the first reset signal PPR_RST1. The third inverter 953 may invert an output of the third NOR gate 952 and may output the inverted signal as the third enable reset signal RST3. Therefore, when the guard key enable signal GKEN is disabled to a logic low level, the enable reset signal generator 920 may enable the third enable reset signal RST3 to a logic high level regardless of the logic levels of the common guard key CGK and the third guard key GK3. When the guard key enable signal GKEN is enabled to a logic high level, the enable reset signal generator 920 may generate the third enable reset signal RST3 by comparing the logic levels of the common guard key CGK to the third guard key GK3. The enable reset signal generator 920 may retain the third enable reset signal RST3 in a disabled state when both of the common guard key CGK and the third guard key GK3 are at a logic high level and may enable the third enable reset signal RST3 to a logic high level when the logic levels of the common guard key CGK and the third guard key GK3 are different from each other.

The fourth NAND gate 961 may receive the common guard key CGK, the fourth guard key GK4, and the guard key enable signal GKEN. The fourth NOR gate 962 may receive an output of the fourth NAND gate 961 and the first reset signal PPR_RST1. The fourth inverter 963 may invert an output of the fourth NOR gate 962 and may output the inverted signal as the fourth enable reset signal RST4. Therefore, when the guard key enable signal GKEN is disabled to a logic low level, the enable reset signal generator 920 may enable the fourth enable reset signal RST4 to a logic high level regardless of the logic levels of the common guard key CGK and the fourth guard key GK4. When the guard key enable signal GKEN is enabled to a logic high level, the enable reset signal generator 920 may generate the fourth enable reset signal RST4 by comparing the logic levels of the common guard key CGK to the fourth guard key GK4. The enable reset signal generator 920 may retain the fourth enable reset signal RST4 in a disabled state when both of the common guard key CGK and the fourth guard key GK4 are at a logic high level and may enable the fourth enable reset signal RST4 to a logic high level when the logic levels of the common guard key CGK and the fourth guard key GK4 are different from each other.

Figure 10:
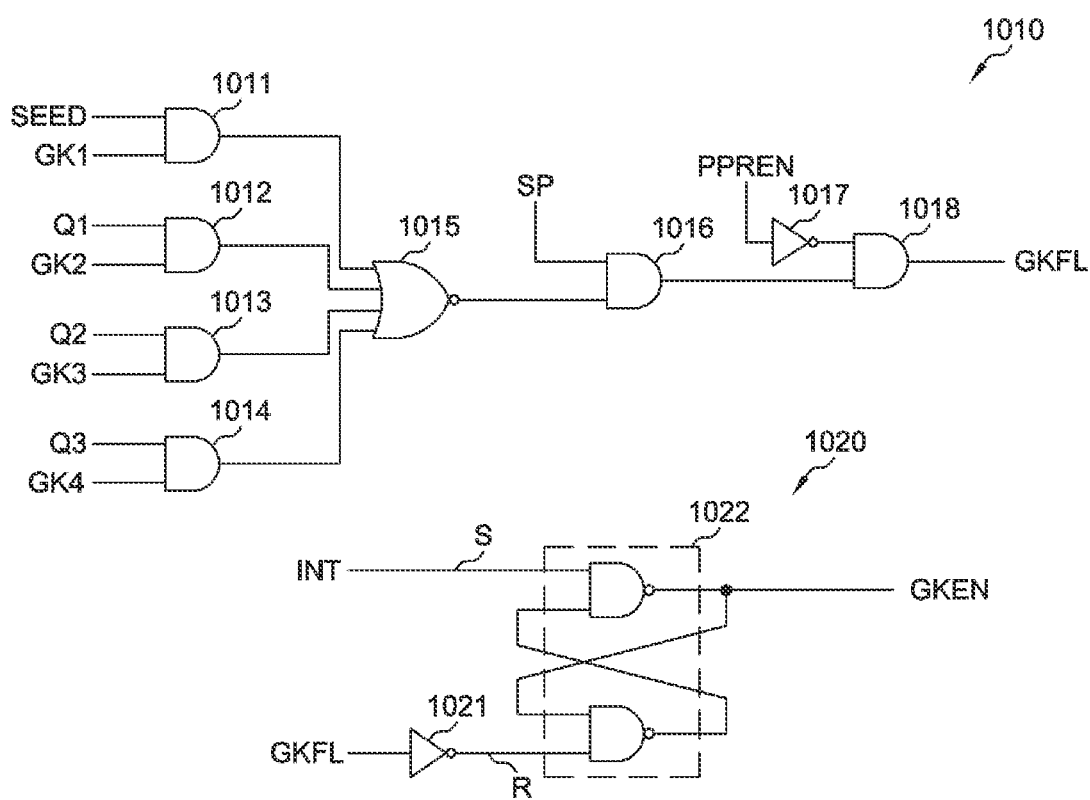
FIG. 10 is a diagram illustrating a configuration of a guard key access control circuit in accordance with an embodiment.

FIG. 10 is a diagram illustrating a configuration of a guard key access control circuit 1000 in accordance with an embodiment. The guard key access control circuit 1000 may be applied as the guard key access control circuit 825, illustrated in FIG. 8. Referring to FIG. 10, the guard key access control circuit 1000 may include a fail detection signal generation circuit 1010 and a guard key enable signal generation circuit 1020. The fail detection signal generation circuit 1010 may generate a fail detection signal GKFL based on the plurality of guard keys GK. The fail detection signal generation circuit 1010 may enable the fail detection signal GKFL when any one of the first to fourth guard keys GK1 to GK4 is disabled. The fail detection signal generation circuit 1010 may further receive the enable signal PPREN. When the enable signal PPREN is enabled, the fail detection signal generation circuit 1010 may disable the fail detection signal GKFL regardless of the logic levels of the first to fourth guard keys GK1 to GK4. The fail detection signal generation circuit 1010 may further receive the seed signal SEED, the plurality of shifting signals, and the strobe pulse SP in order to determine the plurality of guard keys GK. For example, whenever the strobe pulse SP is enabled, the fail detection signal generation circuit 1010 may generate the fail detection signal GKFL by comparing the seed signal SEED to the first to third shifting signals Q1 to Q3 illustrated in FIG. 6 to the first to fourth guard keys GK1 to GK4, respectively.

The guard key enable signal generation circuit 1020 may generate the guard key enable signal GKEN based on the fail detection signal GKFL and the initialization signal INT. The guard key enable signal generation circuit 1020 may disable the guard key enable signal GKEN when the fail detection signal GKFL is enabled. The guard key enable signal generation circuit 1020 may retain the disabled state of the guard key enable signal GKEN until the initialization signal INT is inputted. The guard key enable signal generation circuit 1020 may enable the guard key enable signal GKEN when the initialization signal INT is enabled. The predetermined time may be defined as the time interval between the point of time in which the guard key enable signal GKEN is disabled and the point of time in which the initialization signal INT is inputted.

The fail detection signal generation circuit 1010 may include a first AND gate 1011, a second AND gate 1012, a third AND gate 1013, a fourth AND gate 1014, a NOR gate 1015, a fifth AND gate 1016, an inverter 1017, and a sixth AND gate 1018. The first AND gate 1011 may receive the seed signal SEED and the first guard key GK1. The second AND gate 1012 may receive the first shifting signal Q1 and the second guard key GK2. The third AND gate 1013 may receive the second shifting signal Q2 and the third guard key GK3. The fourth AND gate 1014 may receive the third shifting signal Q3 and the fourth guard key GK4. The NOR gate 1015 may receive the outputs of the first to fourth AND gates 1011 to 1014. The fifth AND gate 1016 may receive an output of the NOR gate 1015 and the strobe pulse SP. The inverter 1017 may invert the enable signal PPREN. The sixth AND gate 1018 may receive an output of the fifth AND gate 1016 and an output of the inverter 1017 and may output the fail detection signal GKFL.

The fail detection signal generation circuit 1010 may operate as follows. For example, suppose that the first and second guard keys GK1 and GK2 are enabled, and the third guard key GK3 is disabled. The enable signal PPREN may retain a disabled state, and the inverter 1017 may output a logic high level. When the strobe pulse SP is enabled after the seed signal SEED is enabled, the seed signal SEED and the first guard key GK1 may be enabled to a logic high level, and the second to fourth guard keys GK2 to GK4 may be disabled to a logic low level. Since the first AND gate 1011 outputs a logic high level, the output of the NOR gate 1015 may have a logic low level, and the fail detection signal GKFL may retain a logic low level. When the first guard key GK1 is enabled, the first enable reset signal RST1 may retain a disabled state. Thus, the first shifting signal Q1 may be enabled to a logic high level by the enable signal output circuit 824. When the strobe pulse SP is enabled again, the first, third, and fourth guard keys GK1, GK3, and GK4 may be disabled to a logic low level, and the second guard key GK2 may be enabled to a logic high level. Since the second AND gate 1012 outputs a logic high level, the output of the NOR gate 1015 may have a logic low level, and the fail detection signal GKFL may retain a logic low level. When the second guard key GK2 is enabled, the second enable reset signal RST2 may retain a disabled state. Thus, the second shifting signal Q2 may be enabled to a logic high level by the enable signal output circuit 824. When the strobe pulse SP is enabled again, the third guard key GK3 as well as the first, second, and fourth guard keys GK1, GK2, and GK4 may be disabled. The first to fourth AND gates 1011 to 1014 may all output a logic low level, and the output of the NOR gate 1015 may have a logic high level. Therefore, the fail detection signal GKFL may be enabled to a logic high level through the fifth and sixth AND gates 1016 and 1018.

The guard key enable signal generation circuit 1020 may include an inverter 1021 and an SR latch 1022. The inverter 1021 may invert the fail detection signal GKFL. The SR latch 1022 may receive the initialization signal INT through a set terminal S thereof and may receive an output of the inverter 1021 through a reset signal R thereof. The initialization signal INT may be disabled to a logic high level. When the fail detection signal GKFL is enabled to a logic high level while the initialization signal INT is disabled, the SR latch 1022 may disable the guard key enable signal GKEN to a logic low level. When the initialization signal INT is enabled to a logic low level, the SR latch 1022 may enable the guard key enable signal GKEN to a logic high level.

Figure 11:
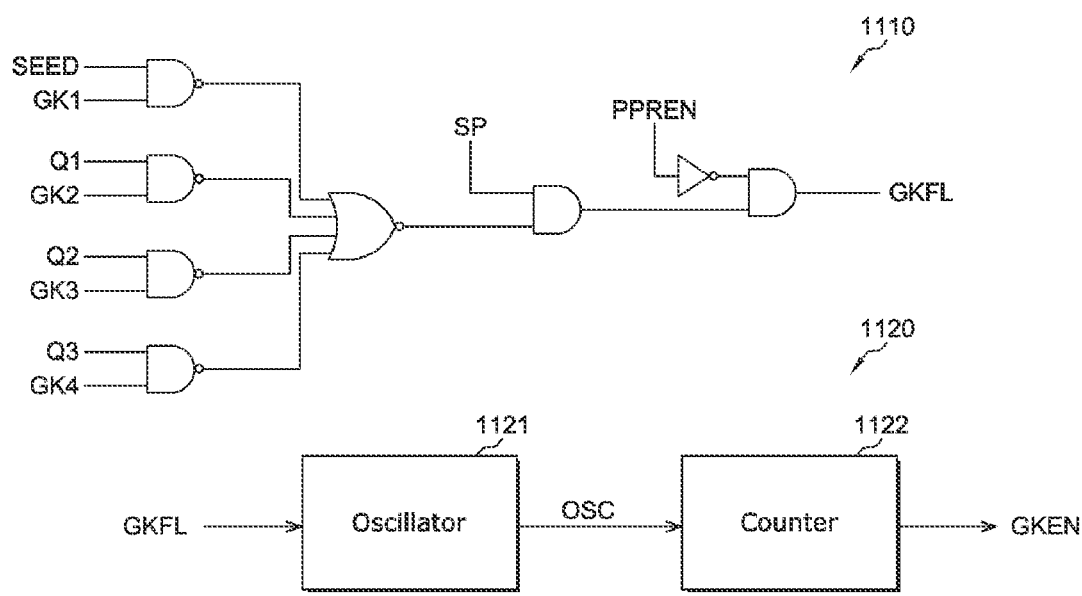
FIG. 11 is a diagram illustrating a configuration of a guard key access control circuit in accordance with an embodiment.

FIG. 11 is a diagram illustrating a configuration of a guard key access control circuit 1100 in accordance with an embodiment. The guard key access control circuit 1100 may be applied as the guard key access control circuit 825 illustrated in FIG. 8. Referring to FIG. 11, the guard key access control circuit 1100 may include a fail detection signal generation circuit 1110 and a guard key enable signal generation circuit 1120. The fail detection signal generation circuit 1110 may have the same configuration as the fail detection signal generation circuit 1010 that is illustrated in FIG. 10 and may perform the same operation as the fail detection signal generation circuit 1010. The overlapping descriptions of the fail detection signal generation circuit 1110 will be omitted herein.

The guard key enable signal generation circuit 1120 may include an oscillator 1121 and a counter 1122. The oscillator 1121 may receive the fail detection signal GKFL and may generate an oscillating signal OSC. The oscillating signal OSC may toggle with a random period. When the fail detection signal GKFL is enabled, the oscillator 1121 may generate the oscillating signal OSC with a random period. The counter 1122 may generate the guard key enable signal GKEN based on the oscillating signal OSC. The counter 1122 may disable the guard key enable signal GKEN when the oscillating signal OSC is inputted. The counter 1122 may count the oscillating signal OSC and may enable the guard key enable signal GKEN when the counting value of the oscillating signal OSC corresponds to a threshold value. For example, the counter 1122 may count the rising edges of the oscillating signal OSC and may detect whether the counting value corresponds to the threshold value, thereby enabling the guard key enable signal GKEN. The period of the oscillating signal OSC and the threshold value may be randomly set to define the predetermined time.

While various embodiments have been described above, it will be understood to those skilled in the art that the embodiments described are examples only. Accordingly, the enable signal generation circuit and the semiconductor apparatus, which have been described herein, should not be limited based on the described embodiments.

What is claimed is:

1. A semiconductor apparatus comprising:
   a command decoding circuit configured to generate an operation code and a strobe pulse based on a command signal and a clock signal; and
   an enable signal generation circuit configured to generate a seed signal based on at least a part of the operation code and the strobe pulse, configured to generate a plurality of guard keys based on a plurality of operation codes and the strobe pulse after the seed signal is generated, configured to generate an enable signal by shifting the seed signal, and configured to prevent the generation of the enable signal for a predetermined time when one or more of the plurality of guard keys are not sequentially enabled.

2. The semiconductor apparatus according to claim 1, wherein the enable signal generation circuit generates a plurality of enable reset signals based on the plurality of guard keys and prevents the generation of the enable signal when one or more of the plurality of enable reset signals are enabled.

3. The semiconductor apparatus according to claim 2, wherein when the plurality of guard keys are not sequentially enabled, the enable signal generation circuit retains the plurality of enable reset signals in an enabled state for the predetermined time.

4. A semiconductor apparatus comprising:
   a command decoding circuit configured to generate an operation code and a strobe pulse based on a command signal and a clock signal;
   a seed signal generation circuit configured to generate a seed signal based on at least a part of the operation code and the strobe pulse;
   a guard key generation circuit configured to generate a plurality of decoding signals by decoding a plurality of operation codes and configured to generate a plurality of guard keys from the plurality of decoding signals based on the strobe pulse;
   a guard key reset circuit configured to generate a plurality of enable reset signals based on the plurality of guard keys and a guard key enable signal;
   a guard key access control circuit configured to generate the guard key enable signal based on the plurality of guard keys; and
   an enable signal output circuit configured to generate an enable signal by shifting the seed signal in synchronization with a shifting clock signal and configured to prevent the generation of the enable signal based on the plurality of enable reset signals.

5. The semiconductor apparatus according to claim 4, wherein the guard key reset circuit comprises:
   a common guard key generator configured to generate a common guard key based on at least a part of one operation code, the strobe pulse, and a detection signal; and
   an enable reset signal generator configured to generate one enable reset signal based on the common guard key and a guard key that are generated from the one operation code.

6. The semiconductor apparatus according to claim 4, wherein, when the first reset signal is enabled, the guard key reset circuit further receives a first reset signal and enables the plurality of enable reset signals regardless of the plurality of guard keys.

7. The semiconductor apparatus according to claim 6, further comprising a first reset signal generation circuit that is configured to generate the first reset signal based on at least a part of the command signal.

8. The semiconductor apparatus according to claim 4, wherein, when the plurality of guard keys are not sequentially enabled, the guard key access control circuit retains the guard key enable signal in a disabled state for a predetermined time.

9. The semiconductor apparatus according to claim 4, wherein, when the guard key enable signal is disabled, the guard key reset circuit enables the plurality of enable reset signals regardless of the plurality of guard keys.

10. The semiconductor apparatus according to claim 4, wherein the enable signal output circuit comprises:
    a shift register circuit configured to generate, when the enable reset signal is enabled, a plurality of shifting signals by shifting the seed signal based on the shifting clock signal and configured to prevent the generation of a shifting signal that corresponds to any one of the plurality of enable reset signals;
    a latch circuit configured to generate the enable signal based on the last shifting signal; and
    a second reset signal generation circuit configured to generate a second reset signal based on the plurality of shifting signals.

11. The semiconductor apparatus according to claim 10, wherein the latch circuit enables the enable signal when the last shifting signal is enabled and disables the enable signal based on the first reset signal.

12. The semiconductor apparatus according to claim 10, wherein the seed signal generation circuit resets the seed signal based on the second reset signal.

13. The semiconductor apparatus according to claim 10, wherein the guard key access control circuit comprises:
- a fail detection signal generation circuit configured to generate a fail detection signal based on the plurality of guard keys; and
- a guard key enable signal generation circuit configured to generate the guard key enable signal based on the fail detection signal and an initialization signal.

14. The semiconductor apparatus according to claim 13, wherein the fail detection signal generation circuit enables the fail detection signal when one or more of the plurality of guard keys are not sequentially enabled and enables the fail detection signal when the enable signal is enabled.

15. The semiconductor apparatus according to claim 13, wherein the guard key enable signal generation circuit disables the guard key enable signal when the fail detection signal is enabled and enables the guard key enable signal when the reset signal is enabled.

16. The semiconductor apparatus according to claim 10, wherein the guard key access control circuit comprises:
- a fail detection signal generation circuit configured to generate a fail detection signal based on the plurality of guard keys; and
- an oscillator configured to generate an oscillating signal when the fail detection signal is enabled,
- wherein the guard key access control circuit disables the guard key enable signal based on the oscillating signal and enables the guard key enable signal when a counting value of the oscillating signal corresponds to a threshold value.

17. The semiconductor apparatus according to claim 4, further comprising a repair circuit configured to perform a post package repair operation based on the enable signal.

18. An enable signal generation circuit comprising:
- a guard key generation circuit configured to generate n decoding signals by decoding n operation codes that are sequentially inputted and configured to generate the n decoding signals as first to $n^{th}$ guard keys based on a strobe pulse, wherein n is an integer equal to or greater than 2;
- a guard key reset circuit configured to generate first to $n^{th}$ enable reset signals based on the first to $n^{th}$ guard keys and a guard key enable signal;
- a guard key access control circuit configured to generate the guard key enable signal based on the first to $n^{th}$ guard keys; and
- an enable signal output circuit configured to generate first to $n^{th}$ shifting signals by shifting a seed signal based on a shifting clock signal, configured to generate an enable signal based on the $n^{th}$ shifting signal, and configured to reset the first to $n^{th}$ shifting signals based on the first to $n^{th}$ enable reset signals.

19. The enable signal generation circuit according to claim 18, wherein the guard key reset circuit comprises:
- a common guard key generator configured to generate a common guard key based on at least a part of one operation code and the strobe pulse; and
- an enable reset signal generator configured to generate the first to $n^{th}$ enable reset signals based on the first to $n^{th}$ guard keys, the common guard key, and the guard key enable signal.

20. The enable signal generation circuit according to claim 18, wherein the guard key access control circuit comprises:
- a fail detection signal generation circuit configured to generate a fail detection signal based on the first to $n^{th}$ guard keys; and
- a guard key enable signal generation circuit configured to generate the guard key enable signal based on the fail detection signal and an initialization signal.

21. The enable signal generation circuit according to claim 18, wherein the guard key access control circuit comprises:
- a fail detection signal generation circuit configured to generate a fail detection signal based on the first to $n^{th}$ guard keys; and
- an oscillator configured to generate an oscillating signal when the fail detection signal is enabled,
- wherein the guard key access control circuit disables the guard key enable signal based on the oscillating signal, and enables the guard key enable signal when a counting value of the oscillating signal corresponds to a threshold value.

* * * * *